(12) United States Patent
Takeuchi

(10) Patent No.: US 9,413,525 B2
(45) Date of Patent: *Aug. 9, 2016

(54) SEMICONDUCTOR DEVICE

(71) Applicant: Renesas Electronics Corporation, Kawasaki-shi, Kanagawa (JP)

(72) Inventor: Masahiro Takeuchi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/725,270

(22) Filed: May 29, 2015

(65) Prior Publication Data

US 2015/0263851 A1 Sep. 17, 2015

Related U.S. Application Data

(63) Continuation of application No. 13/909,598, filed on Jun. 4, 2013, now Pat. No. 9,071,415.

(30) Foreign Application Priority Data

Jun. 8, 2012 (JP) ................. 2012-130777

(51) Int. Cl.
*H04L 7/033* (2006.01)
*H04L 7/00* (2006.01)
(Continued)

(52) U.S. Cl.
CPC ............... *H04L 7/0331* (2013.01); *H03L 7/07* (2013.01); *H03L 7/085* (2013.01); *H03L 7/0807* (2013.01); *H03L 7/089* (2013.01); *H03L 7/0814* (2013.01); *H03L 7/091* (2013.01); *H03L 7/093* (2013.01); *H03L 7/1075* (2013.01); *H04B 1/69* (2013.01); *H04L 7/0025* (2013.01); *H04L 7/033* (2013.01)

(58) Field of Classification Search
CPC ............... H04L 2027/0067; H04L 2027/0057; H04L 2027/003; H04L 27/2273; H04L 27/14; H04L 27/1563; H04L 27/144; H04L 27/22; H04L 27/2332; H04L 27/2657; H04Q 1/46
USPC .......................... 375/326–327, 334–337, 344
See application file for complete search history.

(56) References Cited

U.S. PATENT DOCUMENTS 6,380,774 B2  4/2002  Saeki
7,236,039 B2  6/2007  Ogasawara
(Continued)

FOREIGN PATENT DOCUMENTS

JP  2001-273048 A  10/2001
JP  2005-005999 A  1/2005
(Continued)

*Primary Examiner* — Sam K Ahn
*Assistant Examiner* — Janice Tieu
(74) *Attorney, Agent, or Firm* — Foley & Lardner LLP

(57) ABSTRACT

A frequency tracking loop receives a result from a phase detector that detects an advance and a retard of a phase between input data and an extracted clock signal, and conducts a control to reduce a frequency deviation between the input data and the extracted clock signal. A phase interpolator adjusts a phase of the clock signal subjected to spread-spectrum frequency modulation on the basis result of the frequency deviation in the frequency tracking loop, and outputs the extracted clock signal. In the frequency tracking loop, the frequency deviation between the data signal and the clock signal is corrected to offset a variation of the frequency of the clock signal, on the basis of the frequency modulation information related to the clock signal subjected to the spread-spectrum frequency modulation which is input to the phase interpolator. The frequency of the clock signal seemingly follows the frequency of the data signal.

15 Claims, 30 Drawing Sheets

(51) Int. Cl.

| | | |
|---|---|---|
| H03L 7/07 | (2006.01) | |
| H03L 7/08 | (2006.01) | |
| H03L 7/081 | (2006.01) | |
| H03L 7/089 | (2006.01) | |
| H03L 7/091 | (2006.01) | |
| H03L 7/093 | (2006.01) | |
| H03L 7/107 | (2006.01) | |
| H03L 7/085 | (2006.01) | |
| H04B 1/69 | (2011.01) | |

(56) References Cited

U.S. PATENT DOCUMENTS

| | | |
|---|---|---|
| 7,336,754 B2 | 2/2008 | Aoyama |
| 7,715,514 B2 | 5/2010 | Takeuchi |
| 8,270,553 B2 | 9/2012 | Ogasawara et al. |
| 2006/0056564 A1* | 3/2006 | Takeuchi ............... H03L 7/0814 375/376 |
| 2008/0172195 A1* | 7/2008 | Nakadaira ........ G01R 31/31709 702/72 |
| 2011/0037505 A1* | 2/2011 | Kawamoto ................ H03L 7/07 327/159 |

FOREIGN PATENT DOCUMENTS

| | | |
|---|---|---|
| JP | 2006-080991 A | 3/2006 |
| JP | 2006-166049 A | 6/2006 |
| JP | 2010-283830 A | 12/2010 |
| JP | 2011-041121 A | 2/2011 |
| JP | 2011-234009 A | 11/2011 |

* cited by examiner

FIG. 4

| INPUT | | | | OUTPUT | |
|---|---|---|---|---|---|
| UP00 | DOWN00 | UP01 | DOWN01 | UP1 | DOWN1 |
| 0 | 0 | 0 | 0 | 0 | 0 |
| 0 | 0 | 0 | 1 | 0 | 1 |
| 0 | 0 | 1 | 0 | 1 | 0 |
| 0 | 0 | 1 | 1 | 0 | 0 |
| 0 | 1 | 0 | 0 | 0 | 1 |
| 0 | 1 | 0 | 1 | 0 | 1 |
| 0 | 1 | 1 | 0 | 0 | 0 |
| 0 | 1 | 1 | 1 | 0 | 0 |
| 1 | 0 | 0 | 0 | 1 | 0 |
| 1 | 0 | 0 | 1 | 0 | 0 |
| 1 | 0 | 1 | 0 | 1 | 0 |
| 1 | 0 | 1 | 1 | 0 | 0 |
| 1 | 1 | 0 | 0 | 0 | 0 |
| 1 | 1 | 0 | 1 | 0 | 0 |
| 1 | 1 | 1 | 0 | 0 | 0 |
| 1 | 1 | 1 | 1 | 0 | 0 |

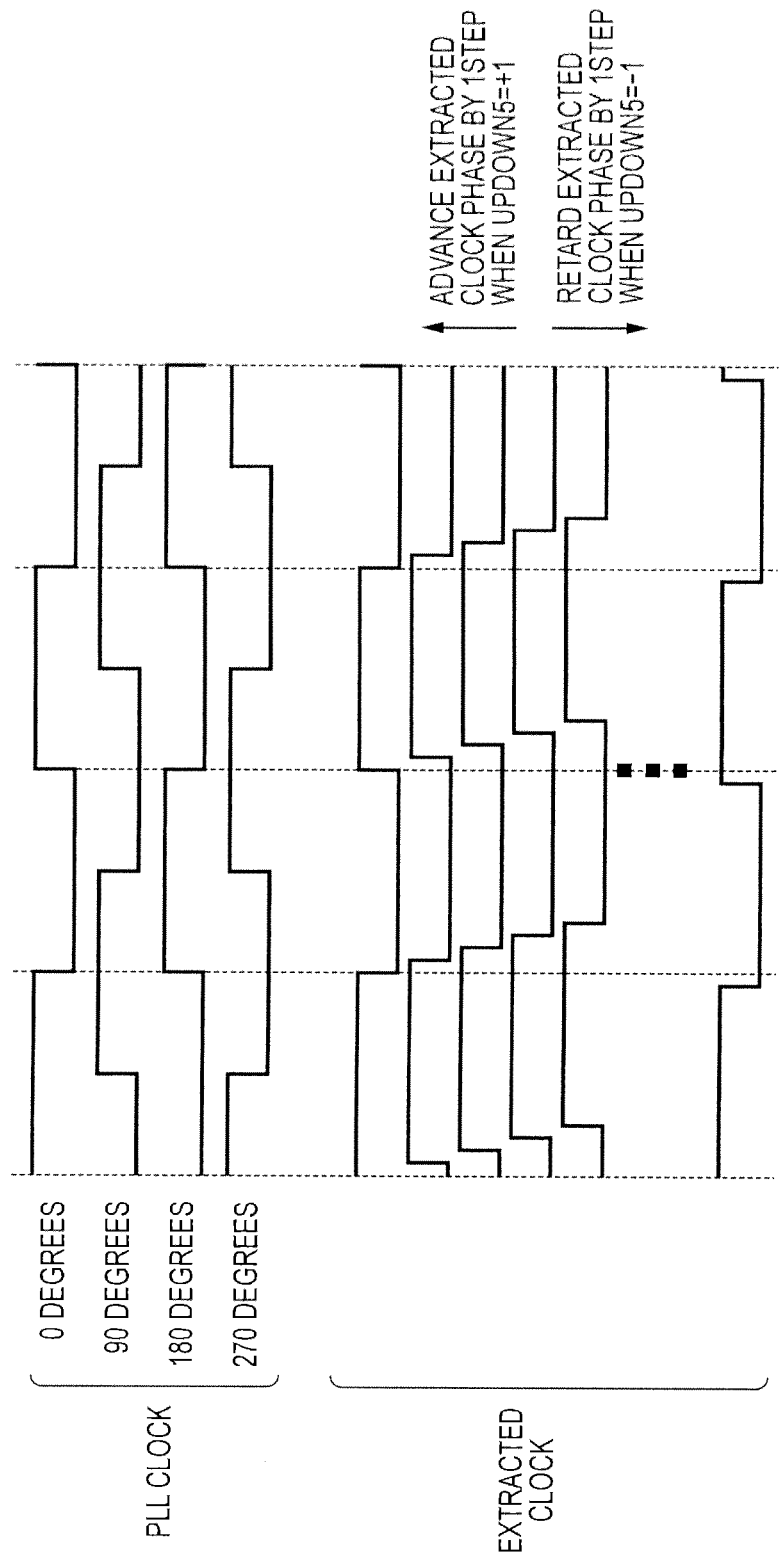

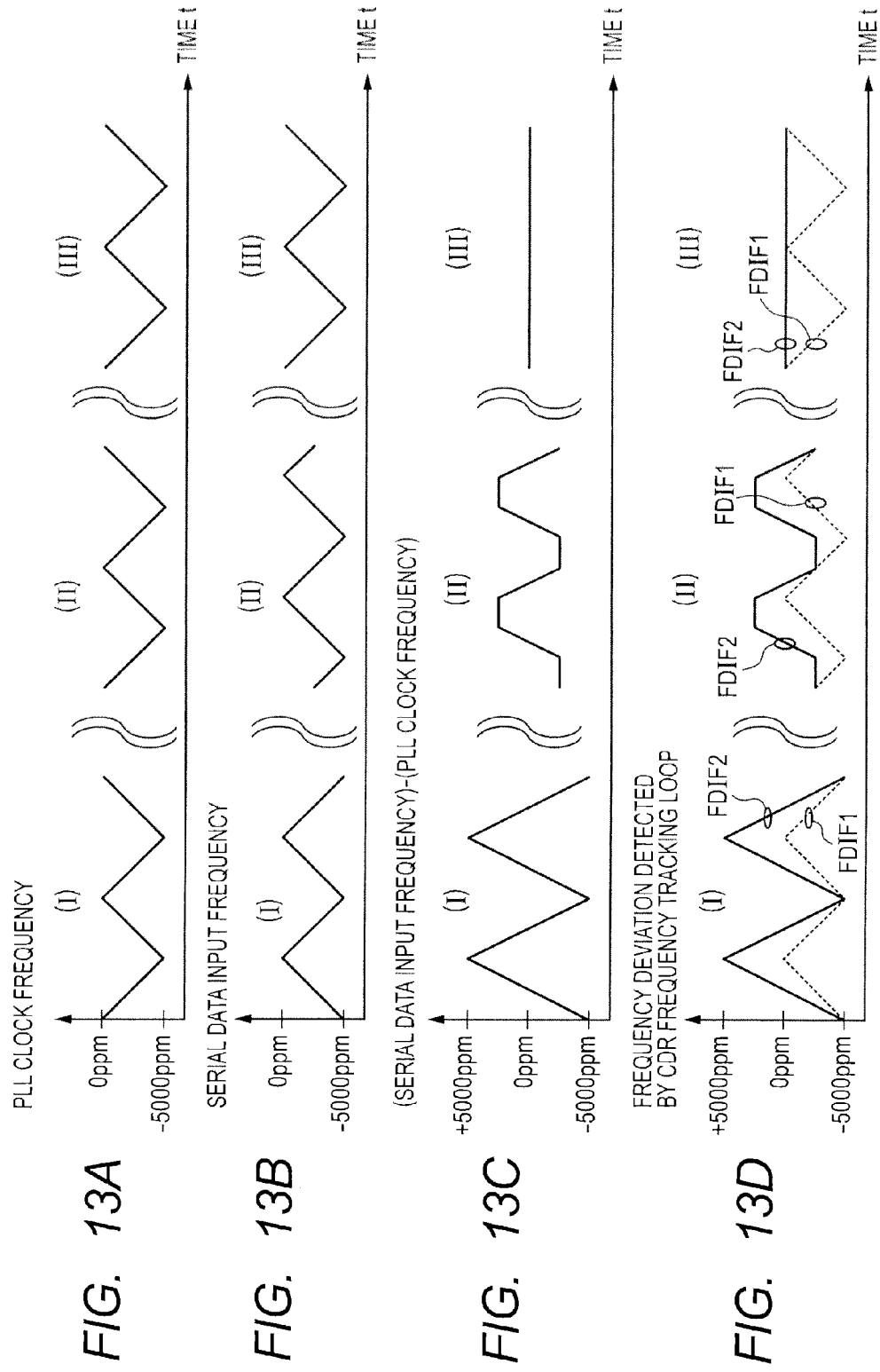

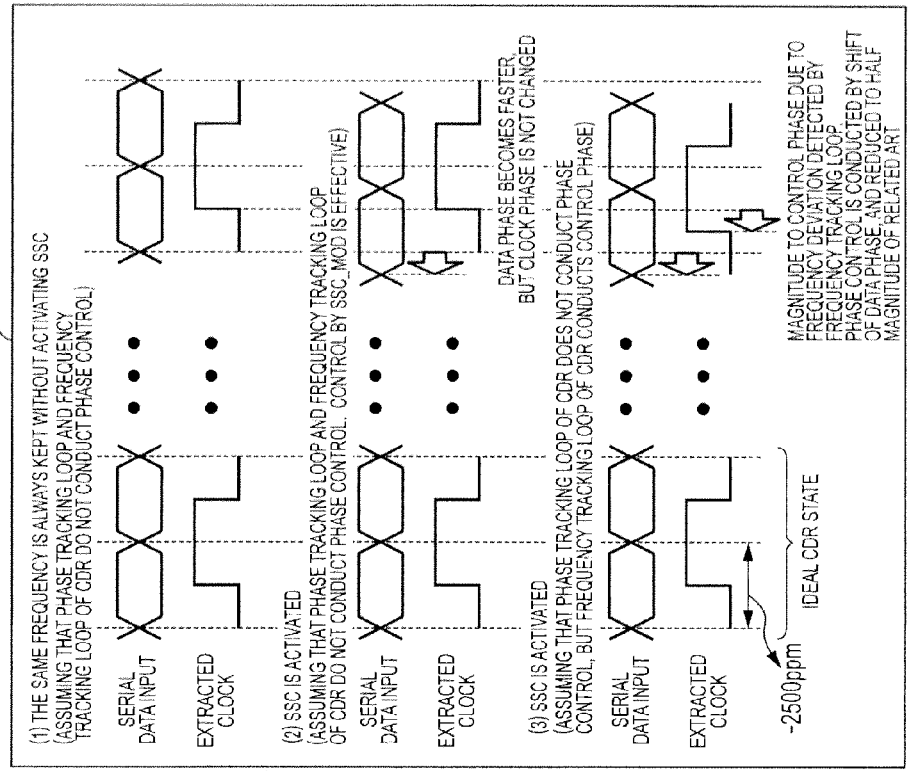
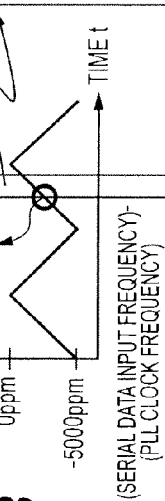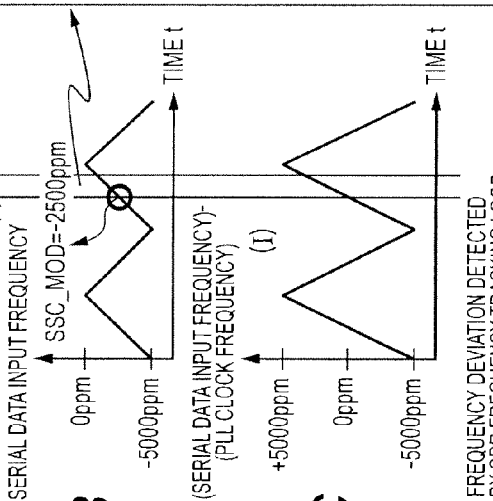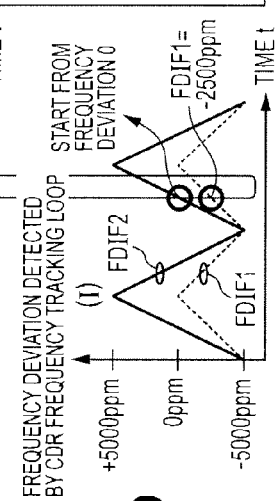

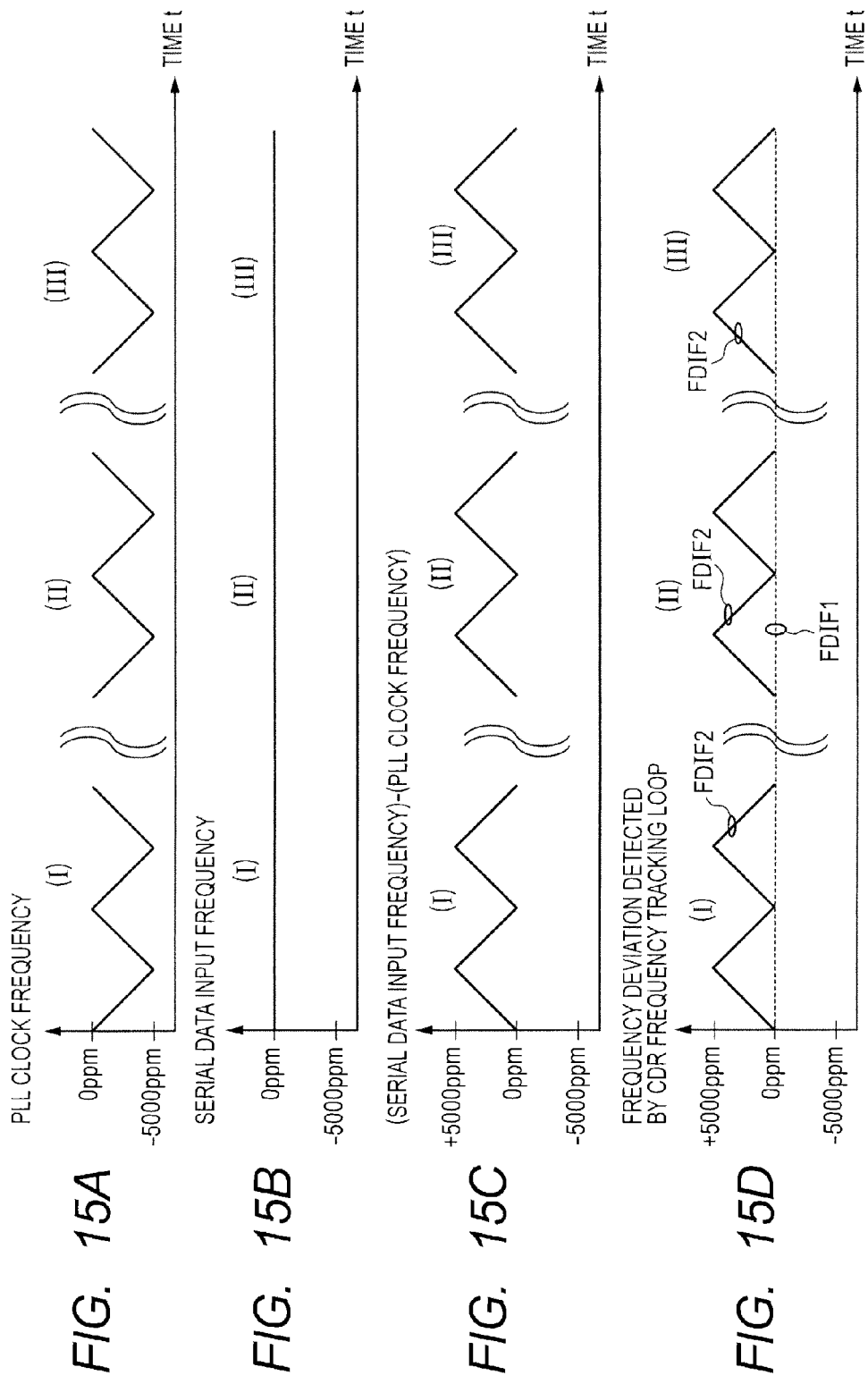

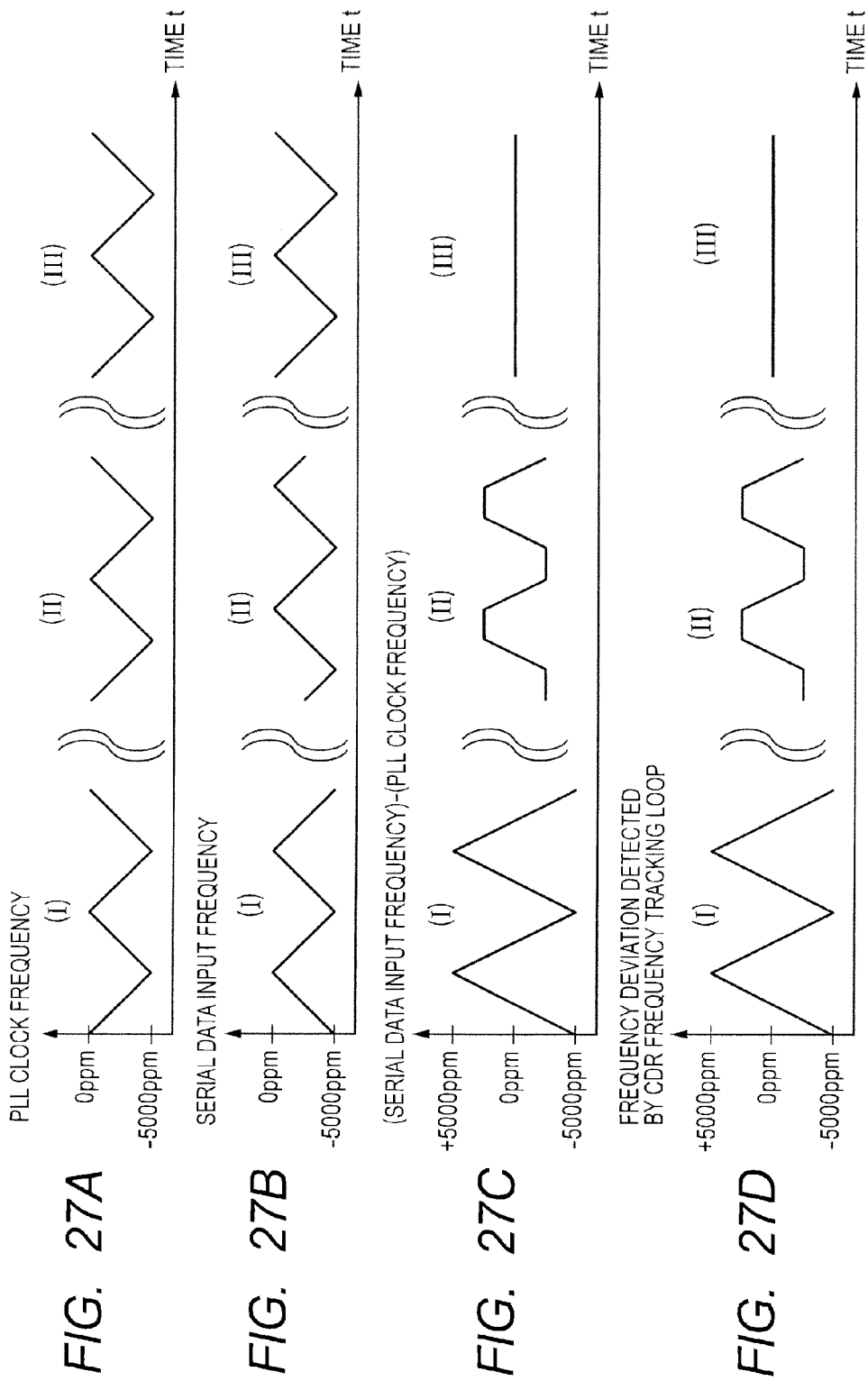

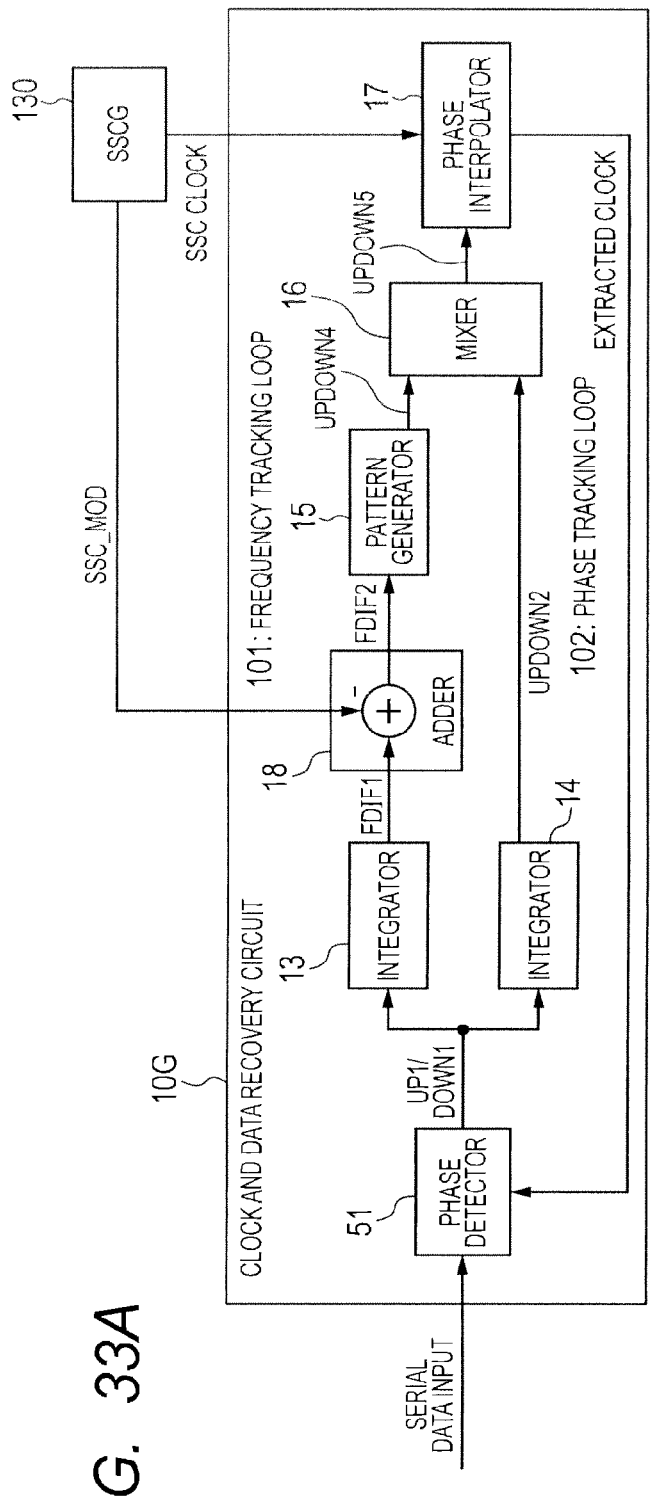
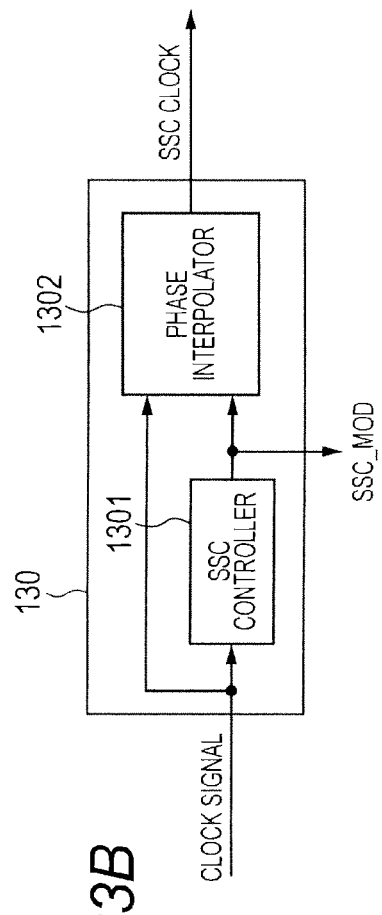
FIG. 33A
FIG. 33B

SEMICONDUCTOR DEVICE

CROSS-REFERENCE TO RELATED APPLICATIONS

This application is a continuation of U.S. application Ser. No. 13/909,598, filed Jun. 4, 2013, which claims benefit of priority from the prior Japanese Application No. 2012-130777, filed Jun. 8, 2012; the entire contents of all of which are incorporated herein by reference.

BACKGROUND

The present invention relates to a semiconductor device having a clock and data recovery circuit.

A clock and data recovery (CDR) circuit that recovers a clock signal and a data signal from a received data is disclosed in, for example, Japanese Unexamined Patent Application Publication No. 2005-5999, No. 2006-80991, and No. 2011-234009.

For example, as illustrated in FIG. 25, a serdes (serializer/deserializer) that mutually convert serial data and parallel data includes pairs (one or plural pairs of) of transmitter circuits 43 and receiver circuits 41, and a PLL (phase locked loop) 30. One PLL 30 is connected with one or more of the transmitter circuits 43 and one or more of the receiver circuits 41.

Each of the receiver circuits 41 includes a clock and data recovery circuit 50 that receives serial data and a PLL clock signal from the PLL 30, and extracts a clock signal synchronous with the serial data, and a serial/parallel converter circuit 42 that converts the serial data into parallel data with the use of the serial data and the clock signal which are extracted by the clock and data recovery circuit 50. Each of the transmitter circuits 43 includes a parallel/serial converter circuit 44 that receives the parallel data, and converts and outputs the parallel data into serial data on the basis of the PLL clock signal.

In a serdes interface, the clock and data recovery circuit 50 receives the serial data that has been subjected to spread-spectrum frequency modulation, and extracts the clock signal (clock signal modulated by the spread-spectrum frequency modulation) synchronous with the serial data.

An SSC (spread spectrum clocking) clock signal which is subjected to the spread-spectrum frequency modulation is input to the clock and data recovery circuit 50 as the clock signal. The SSC clock signal adds a dither to a clock frequency to reduce an electro-magnetic interference (EMI). An SSC clock generator device that generates the SSC clock signal is disclosed in, for example, Japanese Unexamined Patent Application Publication No. 2006-166049. Also, a PLL having an SSC controller is disclosed in Japanese Unexamined Patent Application Publication No. 2010-283830. The PLL 30 in FIG. 25 includes the SSC controller, and outputs the SSC clock signal.

Each of the transmitter circuits 43 receives the PLL clock signal (SSC clock signal subjected to the spread-spectrum frequency modulation) from the PLL 30, and conducts parallel/serial conversion on the basis of the PLL clock signal, to thereby output the serial data that has been subjected to the spread-spectrum frequency modulation.

Each of the receiver circuits 41 receives the PLL clock signal (SSC clock signal subjected to the spread-spectrum frequency modulation) from the PLL 30, and data (subjected to the spread-spectrum frequency modulation) from a transmitter circuit (not shown) of a counter serdes, and extracts the clock signal and the data in the clock and data recovery circuit 50.

The clock and data recovery circuit 50 samples a serial data input and outputs extracted data according to an extracted clock signal, and the serial/parallel converter circuit 42 converts the extracted serial data into parallel data with the use of the extracted clock, and outputs a parallel data output to a downstream circuit.

When the serial data input and the PLL clock signal are each subjected to the spread-spectrum frequency modulation, the clock and data recovery circuit 50 needs to follow not only a phase difference of the data and the clock, but also a frequency deviation.

FIG. 26 is a diagram based on FIG. 1 of Japanese Unexamined Patent Application Publication No. 2005-5999. Referring to FIG. 26, in the clock and data recovery circuit 50, a phase detection unit 51 receives the serial data input and the extracted clock signal (extracted clock output by the clock and data recovery circuit 50), detects a retard or an advance of the phase with the result of sampling the serial data according to the extracted clock signal as the extracted data, and outputs a control signal UP1/DOWN1 (up1/down1) indicative of a phase comparison result.

An integrator 14 integrates the control signal UP1/DOWN1 from the phase detection unit 51, and outputs a control signal UPDOWN2.

An integrator 13 integrates the control signal UP1/DOWN1 from the phase detection unit 51, and outputs a control signal UPDOWN3.

A pattern generator 15 receives the control signal UPDOWN3 from the integrator 13, and outputs a control signal UPDOWN4.

A mixer 16 receives the control signal UPDOWN2 from the integrator 14 and the control signal UPDOWN4 from the pattern generator 15, and outputs a control signal UPDOWN5.

A phase interpolator 17 interpolates a phase of the input PLL clock signal (clock signal subjected to the spread-spectrum frequency modulation) on the basis of the control signal UPDOWN5 from the mixer 16. The extracted clock signal output from the phase interpolator 17 is fed back to the phase detection unit 51.

As illustrated in FIG. 26, the clock and data recovery circuit 50 is equipped with a phase tracking loop and a frequency tracking loop. In a spread spectrum clocking (SSC) system, the serial data input and the clock signal, which are input to the clock and data recovery circuit 50, are each swept in frequency, and the frequency deviation is always changed momentarily.

In the frequency tracking loop, a frequency deviation between the serial data input subjected to the spread-spectrum frequency modulation and the clock signal subjected to the spread-spectrum frequency modulation is detected to conduct a feedback control so that a frequency of the extracted clock signal tracks a frequency of the serial data input.

SUMMARY

Hereinafter, the related art will be described.

In the clock and data recovery circuit 50 described with reference to FIG. 26, the serial data input and the PLL clock signal to be input thereto are subjected to the spread-spectrum frequency modulation, independently.

For that reason, in the frequency tracking loop of the clock and data recovery circuit 50, as compared with a case in which only one of the serial data input and the PLL clock signal is subjected to the spread-spectrum frequency modulation, a load is doubled in the worst case. An excellent idea that the characteristics of the clock and data recovery circuit are more improved has not been proposed up to now.

The other objects and novel features will become apparent from the description of the present invention and the attached drawings.

According to one aspect of the present invention, there is provided a clock recovery circuit including: a phase detector that detects an advance and a retard of a phase between input data and an extracted clock signal; a frequency tracking loop that conducts a tracking control to reduce a frequency deviation between a frequency of the input data and a frequency of the extracted clock signal on the basis of a result of integrating a detection result of the phase detector together; and a phase interpolator that receives a clock signal subjected to spread-spectrum frequency modulation from a clock generator, adjusts a phase of the clock signal on the basis of a detection result of the frequency deviation in the frequency tracking loop, and supplies the clock signal to the phase detector as the extracted clock signal. The frequency tracking loop receives frequency modulation information corresponding to the clock signal subjected to the spread-spectrum frequency modulation from the clock generator, corrects the frequency deviation on the basis of the frequency modulation information, and offsets the frequency modulation of the clock signal. In the frequency tracking loop, a value (or an integration result of the value) obtained by adding an offset of the value corresponding to the frequency modulation information to an integral value (a detection result of the phase detector) of the detection result of the phase detector may be treated as the frequency deviation detected by the frequency tracking loop.

According to the above configuration, a processing load of the frequency tracking can be reduced, and the characteristics can be improved.

BRIEF DESCRIPTION OF THE DRAWINGS

FIG. 4 is a true table illustrating the operation of the phase detector;

FIG. 11 is a diagram illustrating an operation example of a phase interpolator;

FIGS. 13A to 13D are diagrams illustrating the operation of the first embodiment;

FIGS. 14A to 14E are diagram illustrating the operation of the first embodiment;

FIGS. 15A to 15D are diagrams illustrating the operation of the first embodiment;

FIGS. 27A to 27D are diagrams illustrating a problem with the clock and data recovery circuit in the related art;

FIGS. 33A and 33B are diagrams illustrating another embodiment.

DETAILED DESCRIPTION

Figure 1:
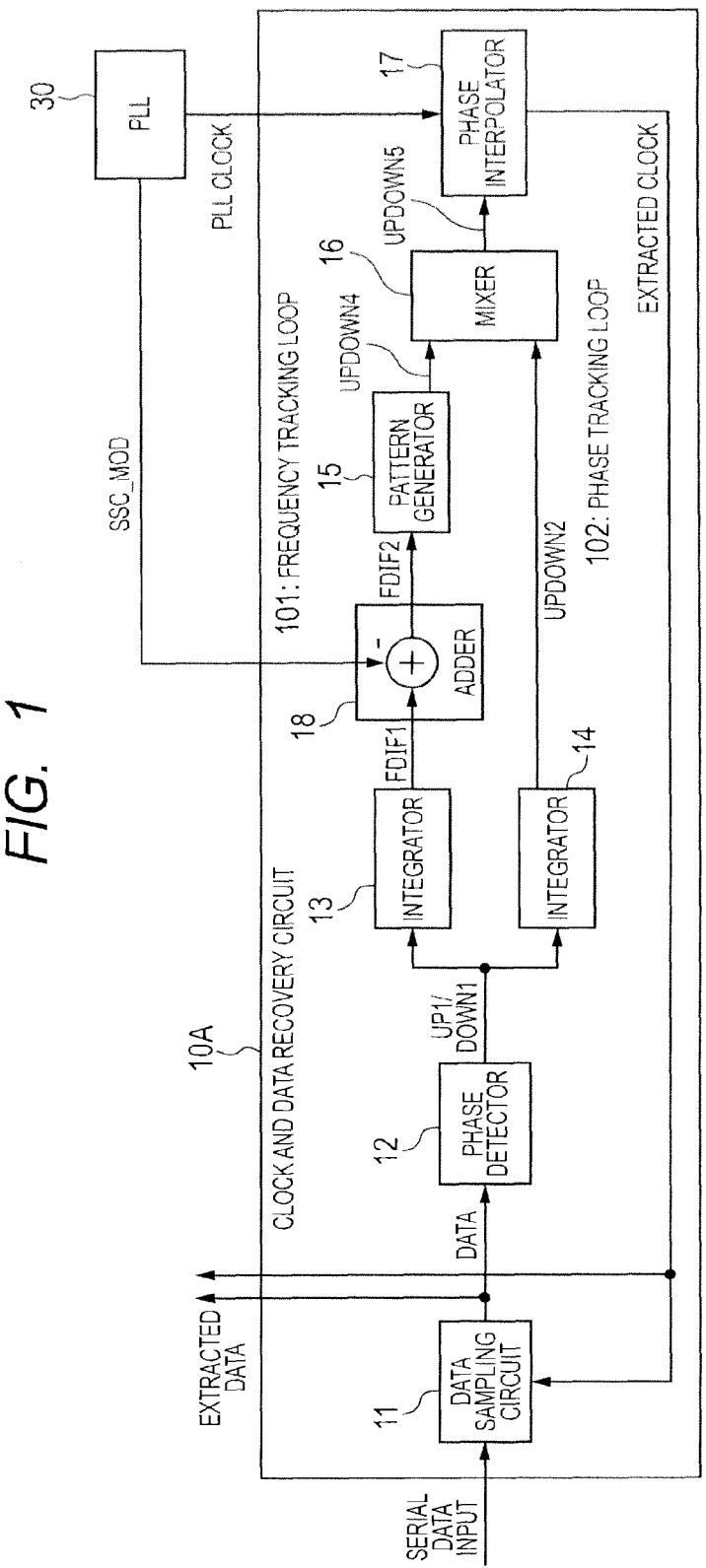
FIG. 1 is a diagram illustrating a configuration of a clock and data recovery circuit according to a first embodiment.

Hereinafter, embodiments will be described in detail with reference to the accompanying drawings.

According to one aspect of the present invention, there is provided a semiconductor device including: a phase detector (51 in FIG. 32) that detects an advance and a retard of a phase between input data and an extracted clock signal; a frequency tracking loop (101 in FIG. 32) that conducts a tracking control of a frequency to reduce a frequency deviation between a frequency of the data and a frequency of the extracted clock signal on the basis of a result of integrating a detection result of the phase detector together; and a phase interpolator (17) that receives a clock signal subjected to spread-spectrum frequency modulation from a clock generator (130), adjusts a phase of the clock signal on the basis of the frequency deviation detected in the frequency tracking loop, and supplies the clock signal to the phase detector as the extracted clock signal. The frequency tracking loop (101) receives frequency modulation information corresponding to the clock signal (SSC clock signal) subjected to the spread-spectrum frequency modulation from the clock generator, corrects the frequency deviation on the basis of the frequency modulation information, and offsets the frequency modulation of the clock signal. In the frequency tracking loop, a value obtained by adding an offset (frequency offset) of the value corresponding to the frequency modulation information to an integral value of the detection result of the phase detector is treated as the frequency deviation detected by the frequency tracking loop. Alternatively, in the frequency tracking loop, an integration result of the values obtained by adding an offset of the value corresponding to the frequency modulation information to the detection result of the phase detector may be treated as the frequency deviation detected in the frequency tracking loop.

According to a second aspect of the present invention, the frequency tracking loop (101 in FIGS. 1, 19, 33A, 33B, 16, 21, and 22) includes a circuit (adder 18 in FIGS. 1, 19, and 33, and adder 19 in FIGS. 16, 21, and 22) that adds or subtracts the frequency modulation information to or from an output (output of integrator 13 in FIGS. 1, 19, and 33A, 33B), or an input (input of integrator 13 in FIGS. 16, 21, and 22) of a first integrator that integrates the detection result of the phase detector together.

According to a third aspect of the present invention, the data is data subjected to the spread-spectrum frequency modulation by a source of the data apart from the clock signal, and received by the clock recovery circuit (FIGS. 1, 32, and 33A, 33B).

According to a fourth aspect of the present invention, the data is data having a constant frequency at the source of the input data, and received by the clock and data recovery circuit (FIGS. 15A to 15D).

According to a fifth aspect of the present invention, the frequency tracking loop (101 in FIG. 1) includes: a first integrator (13 in FIG. 1) that integrates a first control signal (UP1/DOWN1) which is the phase detection result of the phase detector (12 in FIG. 1), and outputs a second control signal; an arithmetic unit (adder 18 in FIG. 1) that outputs a result of adding the second control signal (FDIF1 in FIG. 1) and a signal obtained by inverting a sign of the frequency modulation information (SSC_MOD in FIG. 1) as a third control signal (FDIF2 in FIG. 1); and a pattern generator (15 in FIG. 1) that receives the third control signal (FDIF2), and outputs a fourth control signal (UPDOWN4 in FIG. 1). The phase tracking loop (102 in FIG. 1) includes a second integrator (14 in FIG. 1) that integrates the first control signal (UP1/DOWN1) which is the phase detection result of the phase detector (12 in FIG. 1) together, and outputs a fifth control signal (UPDOWN2 in FIG. 1). A mixer (16 in FIG. 1) that mixes the fourth control signal (UPDOWN4) from the pattern generator (15) and the fifth control signal (UPDOWN2) from the second integrator (14) together to output a sixth control signal (UPDOWN5 in FIG. 1) is disposed at a junction of the frequency tracking loop (101) and the phase tracking loop (102). The phase interpolator (17 in FIG. 1) interpolates the phase of the clock signal subjected to the spread-spectrum frequency modulation on the basis of the sixth control signal (UPDOWN5) from the mixer (16 in FIG. 1).

Figure 19:
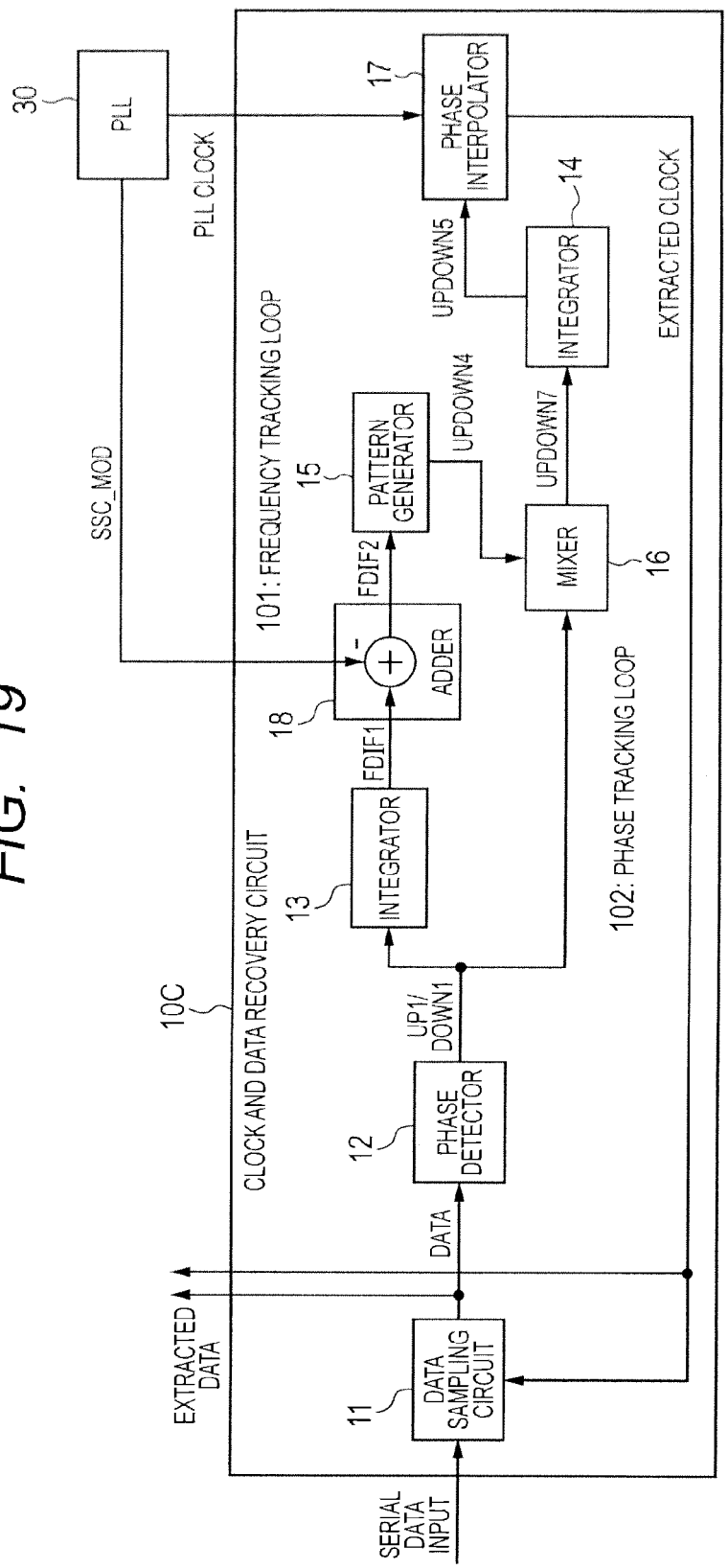
FIG. 19 is a diagram illustrating a configuration of a clock and data recovery circuit according to a third embodiment.

According to a sixth aspect of the present invention, the frequency tracking loop (101 in FIG. 19) includes: a first integrator (13 in FIG. 19) that integrates a first control signal (UP1/DOWN1 in FIG. 19) which is the phase detection result of the phase detector (12 in FIG. 19) together, and outputs a second control signal; an arithmetic unit (18 in FIG. 19) that outputs a result of adding the second control signal (FDIF1 in FIG. 19) and a signal obtained by inverting a sign of the frequency modulation information (SSC_MOD in FIG. 19) as a third control signal (FDIF2 in FIG. 19); and a pattern generator (15 in FIG. 19) that receives the third control signal (FDIF2), and outputs a fourth control signal (UPDOWN4 in FIG. 19). The phase tracking loop (102 in FIG. 19) transmits the first control signal (UP1/DOWN1) from the phase detector (12). A mixer (16 in FIG. 19) that mixes the fourth control signal (UPDOWN4) from the pattern generator (15) and the first control signal (UP1/DOWN1) from the phase detector (12) together to output a fifth control signal (UPDOWN7 in FIG. 19) is disposed at a junction of the frequency tracking loop (101) and the phase tracking loop (102). The semiconductor device further includes a second integrator (14 in FIG. 19) that integrates the fifth control signal (UPDOWN7) together, and outputs a sixth control signal (UPDOWN5 in FIG. 19), and the phase interpolator (17 in FIG. 19) interpolates the phase of the clock signal subjected to the spread-spectrum frequency modulation on the basis of the sixth control (UPDOWN5) signal from the second integrator (14).

Figure 16:
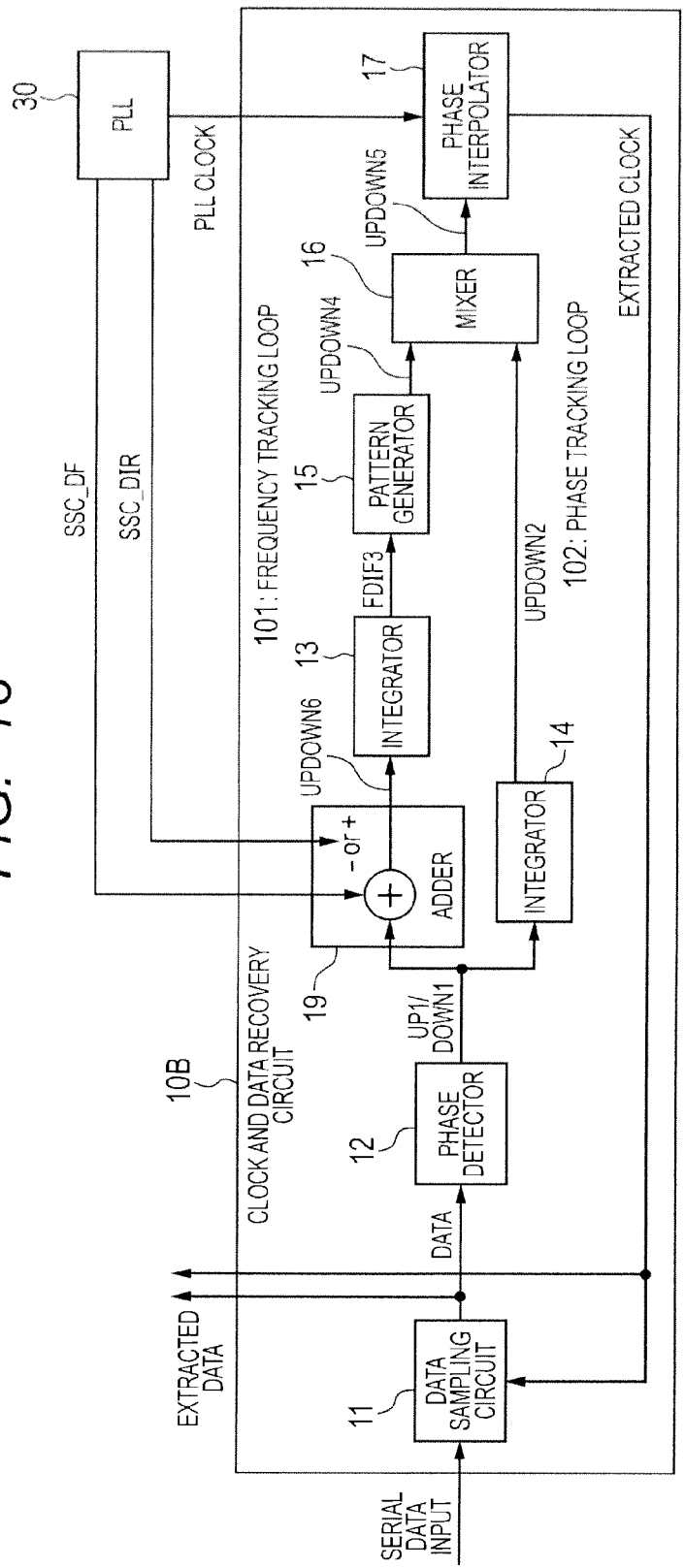
FIG. 16 is a diagram illustrating a configuration of a clock and data recovery circuit according to a second embodiment.

According to a seventh aspect of the present invention, the frequency tracking loop (101 in FIG. 16) includes: an arithmetic unit (adder 19 in FIG. 16) that adds or subtracts an inclination (SSC_DF in FIG. 16) of a spread-spectrum frequency modulation waveform to or from the first control signal (UP1/DOWN1 in FIG. 16) which is the phase detection result of the phase detector (12 in FIG. 16) as the frequency modulation information, and outputs the arithmetic result as a second control signal (UPDOWN6 in FIG. 16); a first integrator (13 in FIG. 16) that integrates the second control signal (UPDOWN6) together, and outputs a third control signal (FDIF3 in FIG. 16); and a pattern generator (15 in FIG. 16) that receives the third control signal (FDIF3), and outputs a fourth control signal (UPDOWN4 in FIG. 16). The phase tracking loop (102 in FIG. 16) includes a second integrator (14 in FIG. 16) that integrates the first control signal (UP1/DOWN1) which is the phase detection result of the phase detector (12) together, and outputs a fifth control signal (UPDOWN2 in FIG. 16). A mixer (16 in FIG. 16) that mixes the fourth control signal (UPDOWN4) from the pattern generator (15) and the fifth control signal (UPDOWN2) from the second integrator (14) together to output a sixth control signal (UPDOWN5 in FIG. 16) is disposed at a junction of the frequency tracking loop (101) and the phase tracking loop (102). The phase interpolator (17 in FIG. 16) interpolates the phase of the clock signal subjected to the spread-spectrum frequency modulation on the basis of the sixth control signal (UPDOWN5) from the mixer (16 in FIG. 16).

Figure 21:
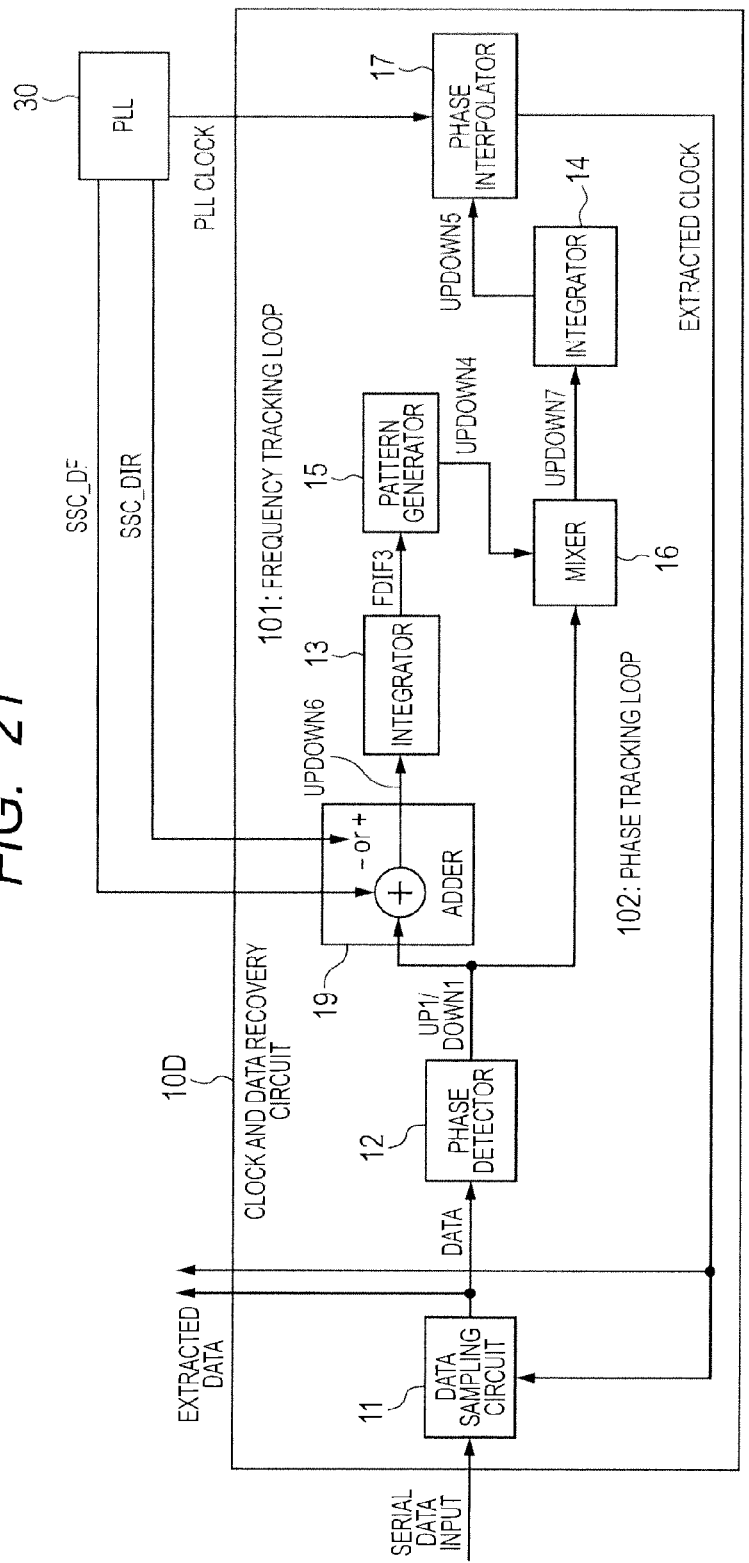
FIG. 21 is a diagram illustrating a configuration of a clock and data recovery circuit according to a fourth embodiment.

According to an eighth aspect of the present invention, the frequency tracking loop (101 in FIG. 21) includes: an arithmetic unit (19 in FIG. 21) that adds or subtracts an inclination (SSC_DF in FIG. 21) of a spread-spectrum frequency modulation waveform to or from the first control signal (UP1/DOWN1 in FIG. 21) which is the phase detection result of the phase detector (12 in FIG. 2) as the frequency modulation information, and outputs the arithmetic result as a second control signal (UPDOWN6 in FIG. 21); a first integrator (13 in FIG. 21) that integrates the second control signal (UPDOWN6) together, and outputs a third control signal (FDIF3 in FIG. 21); and a pattern generator (15 in FIG. 21) that receives the third control signal (FDIF3), and outputs a fourth control signal (UPDOWN4 in FIG. 21). The phase tracking loop (102 in FIG. 21) transmits the first control signal (UP1/DOWN1) from the phase detector (12 in FIG. 21). A mixer (16 in FIG. 21) that mixes the fourth control signal (UPDOWN4) from the pattern generator (15) and the first control signal (UP1/DOWN1) from the phase detector (12) together to output a fifth control signal (UPDOWN7 in FIG. 21) is disposed at a junction of the frequency tracking loop (101) and the phase tracking loop (102). There is further provided a second integrator (14 in FIG. 21) that integrates the fifth control signal (UPDOWN7) together, and outputs a sixth control signal (UPDOWN5 in FIG. 21). The phase interpolator (17 in FIG. 21) interpolates the phase of the clock signal subjected to the spread-spectrum frequency modulation on the basis of the sixth control signal (UPDOWN5) from the second integrator (14 in FIG. 21).

Figure 22:
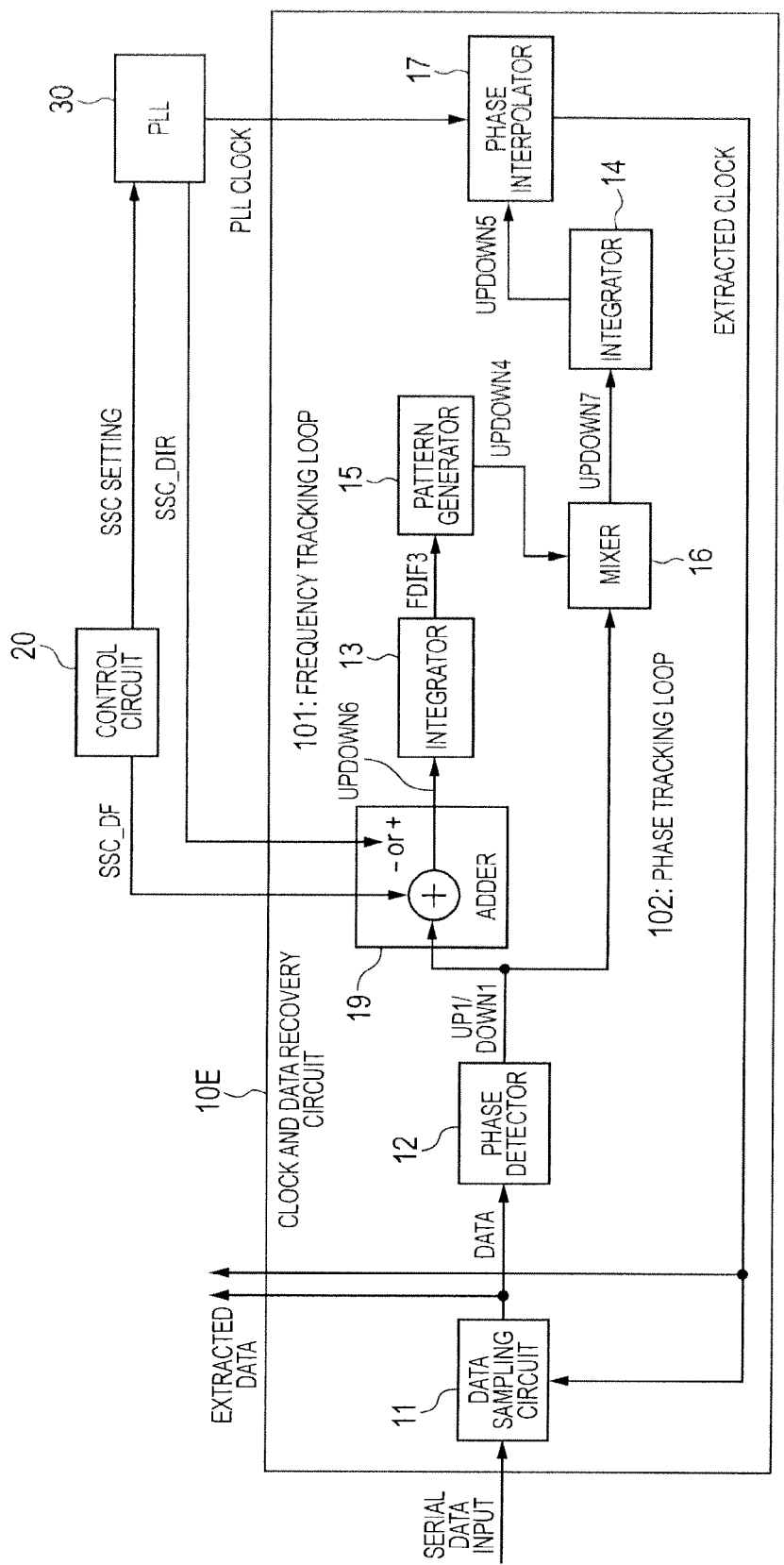
FIG. 22 is a diagram illustrating a configuration of a clock and data recovery circuit according to a fifth embodiment.

According to a ninth aspect of the present invention, the frequency tracking loop (101 in FIG. 22) includes: an arithmetic unit (19 in FIG. 22) that adds or subtracts an inclination (SSC_DF in FIG. 22) of a spread-spectrum frequency modulation waveform to or from the first control signal (UP1/DOWN1 in FIG. 22) which is the phase detection result of the phase detector (12 in FIG. 22) as the frequency modulation information, and outputs the arithmetic result as a second control signal (UPDOWN6 in FIG. 22); a first integrator (13 in FIG. 22) that integrates the second control signal (UPDOWN6) together, and outputs a third control signal (FDIF3 in FIG. 22); and a pattern generator (15 in FIG. 22) that receives the third control signal (FDIF3), and outputs a fourth control signal (UPDOWN4 in FIG. 22). The phase tracking loop (102 in FIG. 22) transmits the first control signal (UP1/DOWN1) from the phase detector (12). A mixer (16 in FIG. 22) that mixes the fourth control signal (UPDOWN4) from the pattern generator (15) and the first control signal (UP1/DOWN1) which is the phase detection result of the phase detector (12) together, and outputs a fifth control signal (UPDOWN7 in FIG. 22), and a second integrator (14 in FIG. 22) that integrates the fifth control signal (UPDOWN7) together, and outputs a sixth control signal (UPDOWN5 in FIG. 22), are disposed at a junction of the frequency tracking loop (101) and the phase tracking loop (102). The phase interpolator (17 in FIG. 22) interpolates the phase of the clock signal subjected to the spread-spectrum frequency modulation on the basis of the sixth control signal (UPDOWN5) from the second integrator (14 in FIG. 22). There is further provided a control circuit (20 in FIG. 22) that outputs a magnitude (SSC_DF) of the inclination of the spread-spectrum frequency modulation waveform to the clock and data recovery circuit. The clock generator (30 in FIG. 22) outputs a direction (SSC_DIR) of the inclination of the spread-spectrum frequency modulation waveform to the arithmetic unit (adder 19 in FIG. 22) of the clock and data recovery circuit.

According to a tenth aspect of the present invention, an absolute value of a magnitude (SSC_DF) of an inclination of the spread-spectrum frequency modulation waveform is kept a constant value through a modulation period.

According to an eleventh aspect of the present invention, in a magnitude (SSC_DF in FIGS. 16, 21, and 22) of an inclination and a direction (SSC_DIR in FIGS. 16, 21, and 22) of the inclination of the spread-spectrum frequency modulation waveform according to the seventh to tenth aspects, the arithmetic unit (19 in FIGS. 16, 21, and 22) may set a value obtained by subtracting or adding the magnitude (SSC_DF) of the inclination of the spread-spectrum frequency modulation waveform from or to the first control signal (UP1/DOWN1 in FIGS. 16, 21, and 22) according to the direction (SSC_DIR) of the inclination as the second control signal (UPDOWN6 in FIGS. 16, 21, and 22).

According to a twelfth aspect of the present invention, in a magnitude (SSC_DF in FIGS. 16, 21, and 22) of an inclination and a direction (SSC_DIR in FIGS. 16, 21, and 22) of the inclination of the spread-spectrum frequency modulation waveform according to the seventh to ninth aspects, the arithmetic unit (19 in FIGS. 16, 21, and 22) includes a circuit (191, 192, and 193 in FIG. 18) that outputs +1 by the number of times corresponding to a numerator of a fraction for the magnitude of the inclination of the spread-spectrum frequency modulation waveform represented by the fraction in an elapsed clock cycle corresponding to a denominator of the fraction, and a circuit (194 in FIG. 18) that adds or subtracts +1 output from the circuit (192 in FIG. 18) to or from the first control signal according to the direction (SSC_DIR) of the inclination.

According to a thirteenth aspect of the present invention, the clock generator includes a PLL (30 in FIG. 1) having a controller (FIGS. 29, 30) for generating the clock signal subjected to the spread-spectrum frequency modulation.

According to a fourteenth aspect of the present invention, there is further provided at least one receiver circuit (41 in FIG. 23) including the clock and data recovery circuit (10A to 10D in FIG. 23), and a serial/parallel converter circuit (42 in FIG. 23) that converts serial data extracted by the clock and data recovery circuit into parallel data according to the extracted clock signal, and one of the clock generator (30 in FIG. 23) is provided in the at least one receiver circuit.

Figure 24:
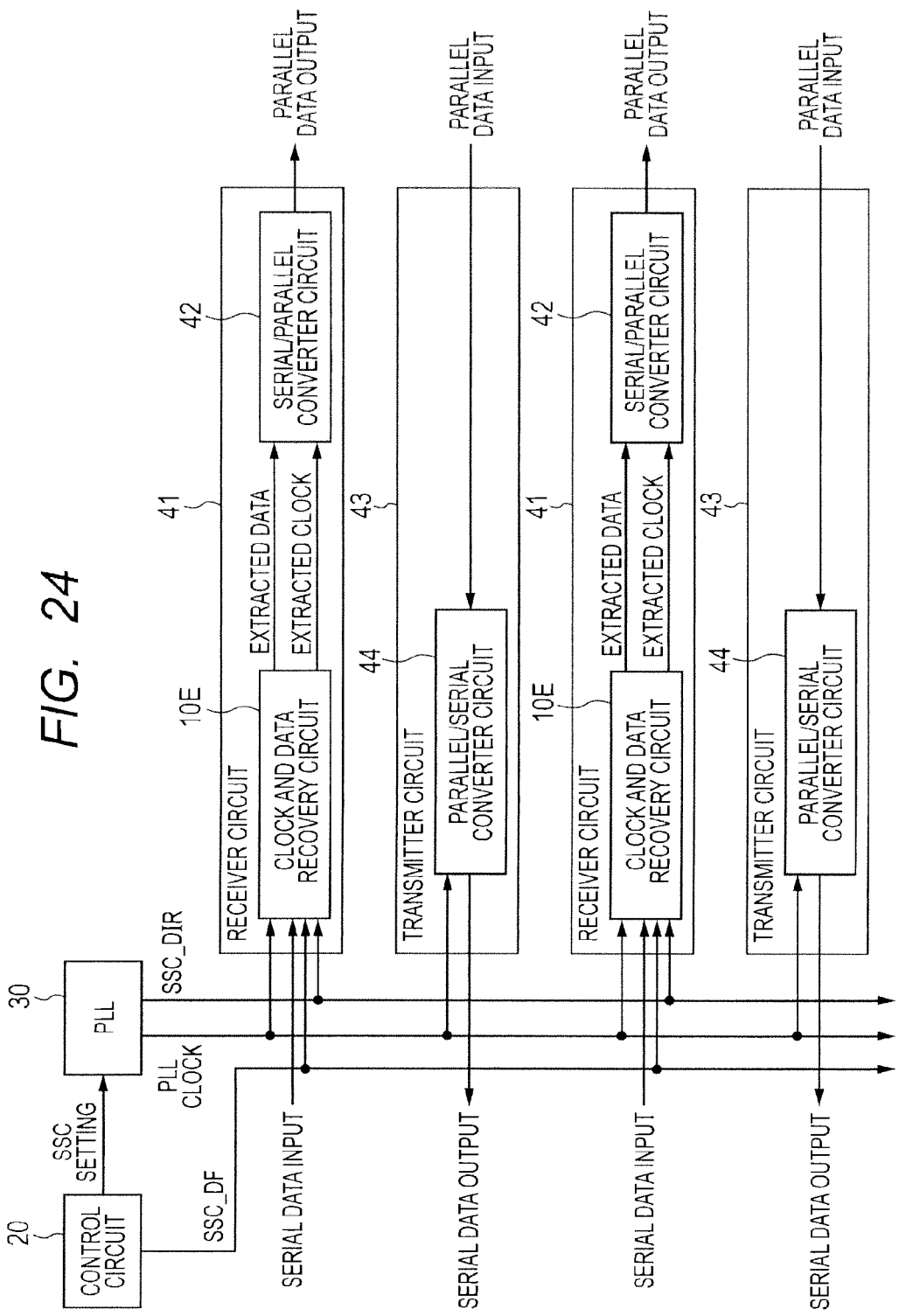
FIG. 24 is a diagram illustrating a configuration example of a serdes circuit according to a seventh embodiment.

According to a fifteenth aspect of the present invention, there is further provided at least one receiver circuit (41 in FIG. 24) including the clock and data recovery circuit, and a serial/parallel converter circuit (42 in FIG. 24) that converts serial data extracted by the clock and data recovery circuit into parallel data according to the extracted clock signal, and one of the clock generator (30 in FIG. 24) and one of the control circuit (20 in FIG. 24) according to the ninth aspect are provided in the at least one receiver circuit (41 in FIG. 24).

Hereinafter, how to invent embodiments will be described. In comparison between a case in which the spread-spectrum frequency modulation is effective and a case in which the spread-spectrum frequency modulation is ineffective, the characteristics (for example, jitter tolerance characteristics) of a clock and data recovery (CDR) circuit is better in the case where the spread-spectrum frequency modulation is ineffective.

For example, even when the PLL clock signal is subjected to the spread-spectrum frequency modulation, the signal with smaller diffusivity has good jitter tolerance characteristics of the clock and data recovery circuit. This is because a load on the clock and data recovery circuit becomes smaller when there is no frequency deviation or a smaller frequency deviation. In the case of down diffusion in which a frequency decreases from f to $-\Delta f$, and again returns to f, the diffusivity $\delta$ is expressed by $-(\Delta f/f) \times 100\%$.

Data to be input to the clock and data recovery circuit is serial data which is subjected to spread-spectrum frequency modulation by a transmitter circuit of a counter serdes device, and then transmitted to the subject device, and the PLL clock signal is subjected to the spread-spectrum frequency modulation by a PLL within the subject device. The serial data and the PLL clock are subjected to the spread-spectrum frequency modulation, independently.

For that reason, in the clock and data recovery circuit, the load is doubled in the worst case. For example, if a frequency of the serial data subjected to the spread-spectrum frequency modulation is $f-\Delta f$ (f: center frequency, $\Delta f$: width of the diffusion frequency), and the frequency of the clock signal subjected to the spread-spectrum frequency modulation is f, the frequency deviation to be tracked by a frequency tracking loop of the clock and data recovery circuit becomes $-\Delta f$. If the frequency of the serial data is f, and the frequency of the clock signal is $f-\Delta f$, a maximum frequency deviation to be tracked by the frequency tracking loop of the clock and data recovery circuit becomes $+\Delta f$, and the amplitude of the frequency deviation becomes $2\Delta f$ at a maximum.

On the other hand, the frequency deviation to be tracked by the frequency tracking loop when only the PLL clock signal (or only the serial data) are subjected to the spread-spectrum frequency modulation is $\Delta f$ at a maximum.

When the frequency deviation to be tracked by the clock and data recovery circuit is $2\Delta f$, if the frequency deviation is processed in the same time as that of $\Delta f$, the resolution capability of the integrator needs to reduce to ½, or the operation needs to be conducted at a double speed.

The present inventors have variously studied proposals for improving the characteristics of the clock and data recovery circuit. The clock signal to be input to the clock and data recovery circuit is generated by the clock generator (SSC clock generator, or PLL having an SSC controller). A modulation waveform (for example, saw tooth wave) drawing an SSC profile (a variation curve (the axis of abscissa: time, the axis of ordinate: frequency) of the clock frequency) of the clock within the device has been well known. Also, the diffusivity, the diffusion mode (down diffusion, center diffusion, up diffusion), and the modulation rate have been well known.

With the use of the SSC profile, the load on the clock and data recovery circuit can be ideally halved. In the frequency tracking loop of the clock and data recovery circuit, a phase control is conducted in proportion to the frequency deviation corresponding to [(frequency of serial data input)−(frequency of PLL clock)] to generate the extracted clock signal. However, −(frequency of PLL clock) has only to be offset on the basis of frequency information of the PLL clock signal to track only the frequency deviation of the serial data input.

With the use of the SSC profile, the circuit can be realized with the following configuration. An arithmetic unit that adds or subtracts the SSC profile (SSC_MOD) from the SSC generator circuit or the SSC controller is inserted into the frequency tracking loop that tracks the frequency deviation.

As an example of the SSC, a case of 30 to 33 kHz and the maximum frequency variation $(-\Delta f)=-5000$ ppm, which is determined by USB 3.0 or Serial ATA (SATA) will be studied. It is assumed that the diffusion mode is the down diffusion (modulation waveform is saw tooth wave) in which when the clock frequency f is reduced to a lower frequency, and reaches $f-\Delta f$, the frequency increases, and returns to the original frequency f (modulation rate $fm=1/(33\ kHz)$ to $1/(30\ kHz)=30$ to 33.3 us (micro second)). In order to flatten a clock spectrum, a specific curve such as "Hershey Kiss™" is used as the modulation waveform.

FIGS. 27A to 27D and 28A to 28E are diagrams illustrating problems with the clock and data recovery circuit in the related art, which have been found by the present inventors as a result of earnestly making a study on an improvement in the characteristics of the clock and data recovery circuit in the related art. The data and the clock are subjected to SSC, independently. The states thereof are illustrated in FIGS. 27A to 27D. That is, FIG. 27A is a diagram illustrating a transition of the frequency (profile) of the spread-spectrum frequency modulation PLL clock with time. FIG. 27B is a diagram illustrating a transition of the frequency (profile) of the serial data input subjected to the spread-spectrum frequency modulation with time. FIG. 27C is a diagram illustrating a transition of (frequency of serial data input)−(frequency of PLL clock) with time. FIG. 27D is a diagram illustrating a transition of the frequency deviation detected by the CDR frequency tracking loop with time. In FIGS. 27A to 27D, time passes in the stated order of (I), (II), and (III). Both of the diffusion modes of the PLL clock and the serial data are the down diffusion in which the frequency f is reduced to $f-\Delta f$, and again returns to f. In the CDR specification of USB 3.0, $\Delta f=0.005=5000$ ppm is met, and changed between f and 0.995 f at a rate between fm=30 to 33 kHz (modulation rate $(=1/fm)=30$ to 33.3 µs). 1 ppm is parts per million.

In the state (I) of FIGS. 27A to 27D, the profiles of the spread-spectrum frequency modulations of the serial data and the PLL clock are opposite to each other (the frequency profile (saw tooth wave) of the PLL clock and the frequency profile (saw tooth wave) of the serial data are reversed in phase, and one of those frequencies is decreased with time while the other frequency is increased with time). In the frequency deviation detected by the CDR frequency tracking loop in FIG. 27D, the amplitude is $+\Delta f$ and $-\Delta f$, and a load on the clock and data recovery circuit is large, resulting in the most severest state. The frequency tracking loop needs to track +5000 ppm to −5000 ppm at the modulation frequencies of 30 kHz to 33 kHz.

In the state (II) of FIGS. 27A to 27D, the frequency deviation (frequency deviation detected by the CDR frequency tracking loop) in FIG. 27D is reduced to +2500 ppm to −2500 ppm, but an inclination per se (temporal variation of the frequency deviation) is sharp, and after all, the tracking is difficult.

In the state (III) of FIGS. 27A to 27D, the spread-spectrum frequency modulations of the serial data and the PLL clock match each other, (frequency of serial data input)−(frequency of PLL clock)=0 is met, and the frequency deviation detected by the CDR frequency tracking loop is 0 ppm.

As a result, the frequency deviation $(=|(\text{frequency of serial data input})-(\text{frequency of PLL clock})|)$ is $2\Delta f(=2\times 5000$ ppm) at a maximum, and becomes twice as large as the frequency deviation $\Delta f$ of the spread-spectrum frequency modulation of the data and the clock.

Figure 26:
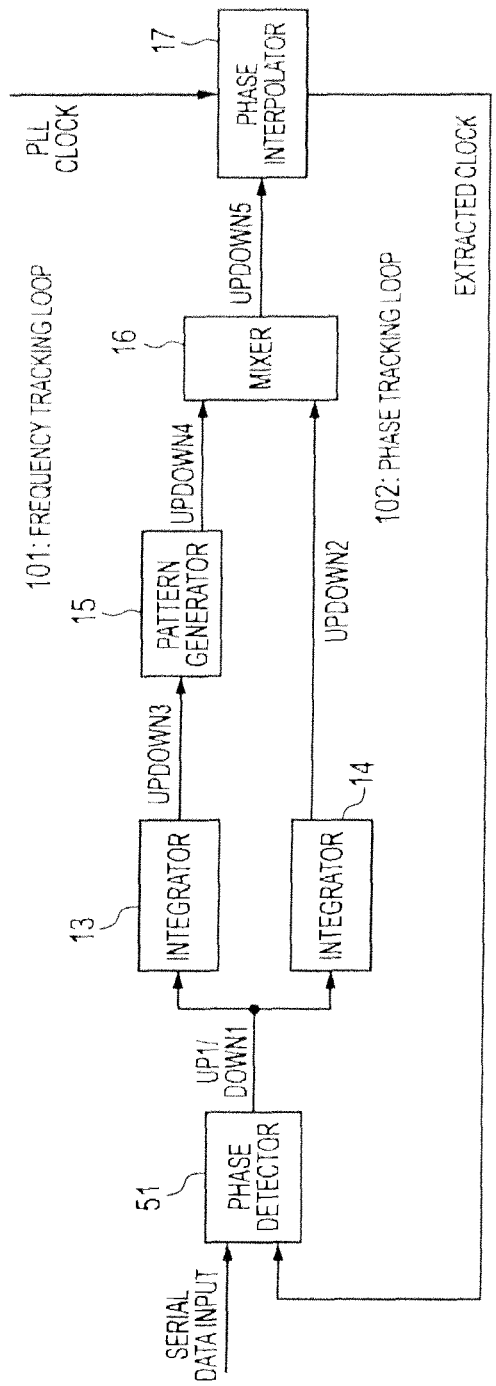
FIG. 26 is a diagram illustrating a configuration of a clock and data recovery circuit in the related art.

In a circuit of FIG. 26, the phase detection unit 51 does not output information on how much the phase is advanced or retarded, but outputs only information on whether the phase is advanced (UP1=active) or retarded (DOWN1=active). On the basis of this information, the integrator 13 increments or decrements the count value by one, and the phase interpolator 17 retards or advances the phase of the PLL clock signal by a unit amount to conduct the tracking control of the phase. However, the frequency tracking operation for the frequency deviation of $2\Delta f$ needs a time twice as long as that in the case of the frequency deviation of $\Delta f$. In order to track the frequency in the same time as that in the frequency deviation of $\Delta f$, the operating speed of the integrator 13 is increased, or an increment or a decrement of the count value of the counter in the integrator 13 per UP1 or DOWN1 needs to be not 1 but 2 (the filter characteristic of the integrator 13 is deteriorated).

Figure 28A:
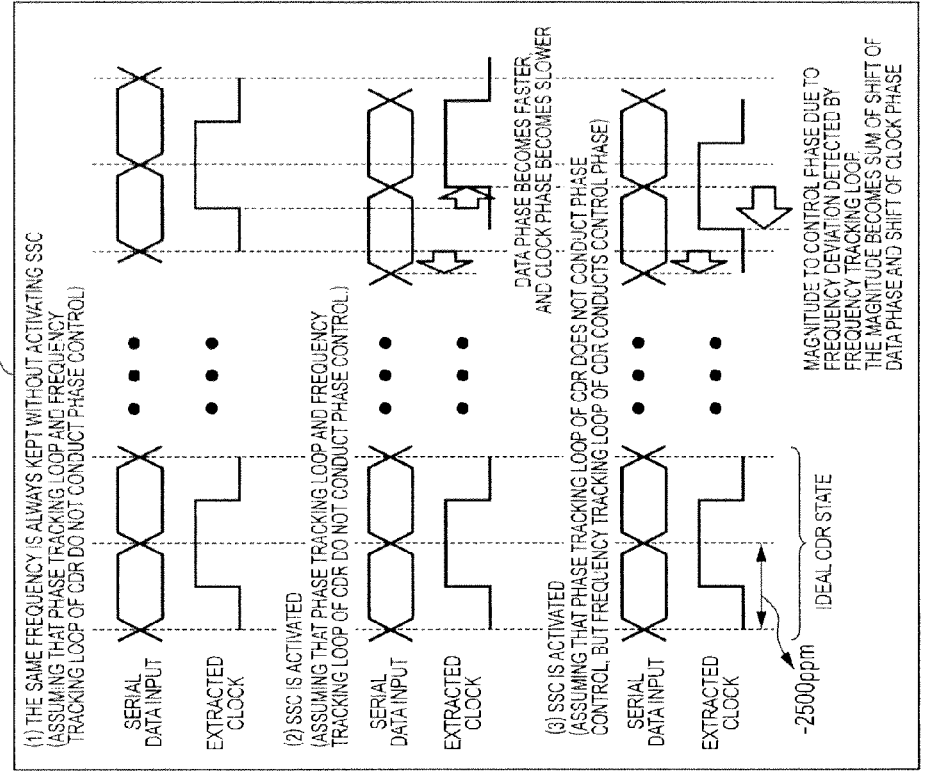
FIGS. 28A to 28E are diagrams illustrating a problem with the clock and data recovery circuit in the related art.
Figure 28B:
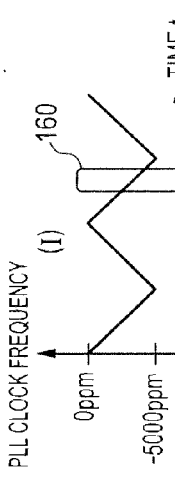
Figure 28C:
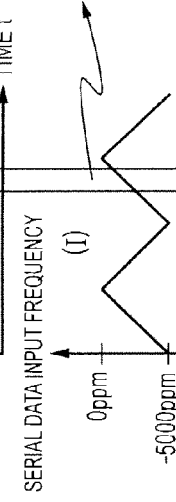
Figure 28D:
Figure 28E:
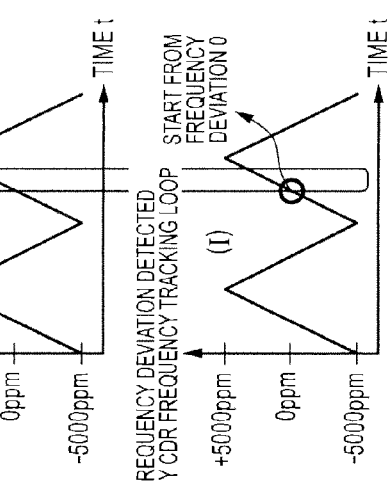

The above operation will be further described with reference to FIGS. 28A to 28E. States (I) of the waveforms of FIGS. 28A, 28B, 28C, and 28D are identical with the states (I) of the waveforms of FIGS. 27A, 27B, 27C, and 27D. In a time frame 160 surrounded by a solid line, the clock frequency f of the PLL clock is going to decrease, and the frequency of the serial data subjected to the spread-spectrum frequency modulation is going to increase. As an operation image in this case, a positional relationship of the serial data and the extracted clock is schematically illustrated in FIG. 28E.

Although not particularly restricted, it is assumed that the serial data input is sampled at timing of a rising edge and a falling edge of the extracted clock signal output from the phase interpolator 17. In this case, in the phase detection unit 51 of FIG. 26, the serial data may be sampled at the rising edge and the falling edge of the extracted clock signal, and output as the extracted data, or the extracted clock signal may be output from the clock and data recovery circuit, and supplied to a sampling circuit not shown. In this case, the sampling circuit includes a first D-type flip-flop that inputs the serial data to a data terminal, and samples the serial data at the rising edge of the extracted clock, and a second D-type flip-flop that inputs the serial data to a data terminal, and samples the serial data at the falling edge of the extracted clock. The sampling circuit outputs the outputs of the first and second D-type flip-flops as the extracted data.

It is assumed that a time (timing) is a time on the left side of the time frame 160 surrounded by the solid line in the state (I) of FIGS. 28A to 28D. That is, the frequency of the PLL clock is −2500 ppm (=0.9975 f), and heads to −5000 ppm (=0.995 f) after this. The frequency of the serial data is −2500 ppm (=0.9975 f), and heads to 0 ppm (=f) after this.

In the frequency tracking loop within the clock and data recovery circuit, the frequencies of the PLL clock and the serial data are both −2500 ppm, and the frequency deviation therebetween is detected to be 0 ppm. Therefore, the phase control of the PLL clock signal by the frequency tracking loop (the integrator 13 and the pattern generator 15 in FIG. 26) is not conducted.

In FIG. 28E, waveforms (1) represent the waveforms of a start (start of the time frame 160: left end) and a subsequent portion (end of the time frame 160: right end) of the waveforms of the serial data input and the extracted clock signal when it is assumed that both of the PLL clock and the serial data are not subjected to the spread-spectrum frequency modulation so that their frequencies are kept constant as they are, and the clock and data recovery circuit does not conduct the phase control at all. A middle of the waveform of the serial data input on the time axis is continued to be sampled at the rising edge and the falling edge of the extracted clock signal. That is, the rising (falling) edge of the extracted clock signal is present in the middle of a serial data period.

However, in fact, the PLL clock signal and the serial data are each subjected to the spread-spectrum frequency modulation, and at the start of the time frame 160, the frequency of the PLL clock signal is going to decrease, and the frequency of the serial data is going to increase. Therefore, if the clock and data recovery circuit does not conduct the phase control at all, the positional relationship of the clock and the data is gradually displaced in the opposite directions as indicated by waveforms (2) of FIG. 28E. In FIG. 28E, the waveforms (2) represent the waveforms of a start (start of the time frame 160: left end) and a subsequent portion (end of the time frame 160: right end) of the waveforms of the serial data input and the extracted clock signal when the clock and data recovery circuit does not conduct the phase control at all. Because the frequency of the PLL clock is going to decrease at the start of the time frame 160, the phase of the extracted clock signal is retarded more than the start of the time frame 160, at the end of the time frame 160 as indicated by a right arrow. Since the frequency of the serial data is going to increase at the start of the time frame 160, the phase of the serial data is advanced at the end of the time frame 160 as indicated by a left arrow.

In FIG. 28E, waveforms (3) represent the waveforms of a start (start of the time frame 160: left end) and a subsequent portion (end of the time frame 160: right end) of the waveforms of the serial data input and the extracted clock, in the case where the clock and data recovery circuit conducts the phase control in the frequency tracking loop, but does not conduct the phase control in the phase control loop when the PLL clock and the serial data are each subjected to the spread-spectrum frequency modulation, and the frequency of the PLL clock is going to decrease, and the frequency of the serial data is going to increase, at the start of the time frame 160. At the start of the time frame 160, the frequency of the PLL clock signal is going to decrease, but the phase control of the extracted clock by the frequency tracking loop is conducted. At the end of the time frame 160, the phase of the extracted clock is advanced more than the start of the time frame 160 as indicated by a left arrow. At a time point of the end of the time frame 160, a phase difference between control targets becomes a phase difference between an arrow tip of the serial data input and an arrow tip of the extracted clock signal. At the end of the time frame 160, a neighborhood of a middle of the serial data input is sampled at each of the rising edge and the falling edge of the extracted clock signal.

The frequency deviation detected by the frequency tracking loop within the clock and data recovery circuit is obtained by integrating the past phase comparison results (UP1/DOWN1 in FIG. 26) at this time point by the integrator 13. Therefore, the frequency deviation is somewhat old information. In the frequency deviation, the characteristic deterioration (portions deviated from the center of data are sampled) is caused by controlling the phase of the clock signal on the basis of the old information.

A difference between the frequency deviation of the PLL clock signal and the serial data at a certain time point, and the frequency deviation of the PLL clock signal detected by the frequency tracking loop within the clock and data recovery circuit, and the serial data becomes larger as an inclination (time variation) of the frequency deviation (refer to FIGS. 27A to 27D, and 28D) detected by the frequency tracking loop is steeper. As a result, the deterioration of the jitter characteristic of the clock and data recovery circuit also becomes larger. If the inclination (time variation) of the frequency deviation is steep, there is a need to increase the tracking speed of the frequency tracking loop within the clock and data recovery circuit. For example, when the integrator 13 of FIG. 26 is configured by an UP/DOWN counter, there is a need to reduce the number of counts. Alternatively, the count value is counted up or down by N (N≥2) by one count up/down (a value per one step is N).

However, as the integrator 13 of the frequency tracking loop functions as a filter (also called LPF: low pass filter), if the number of counts in the counter configuring the integrator 13 is reduced (resolution capability is reduced), there is a possibility that a low frequency component cannot sufficiently been filtered. That a CR integrating circuit of analog reduces the number of counts in the counter (increase the counter value per one step from 1 to N (N≥2)) in correspondence with the counter (integrator 13) of digital corresponds that, in a CR time constant of an analog integrating circuit, a value of the CR time constant is decreased to increase a cutoff frequency $1/(2\pi RC)$.

In this embodiment, the frequency deviation between the serial data input and the PLL clock signal in the frequency tracking loop of the clock and data recovery circuit is reduced to improve the jitter characteristics.

Figure 32:
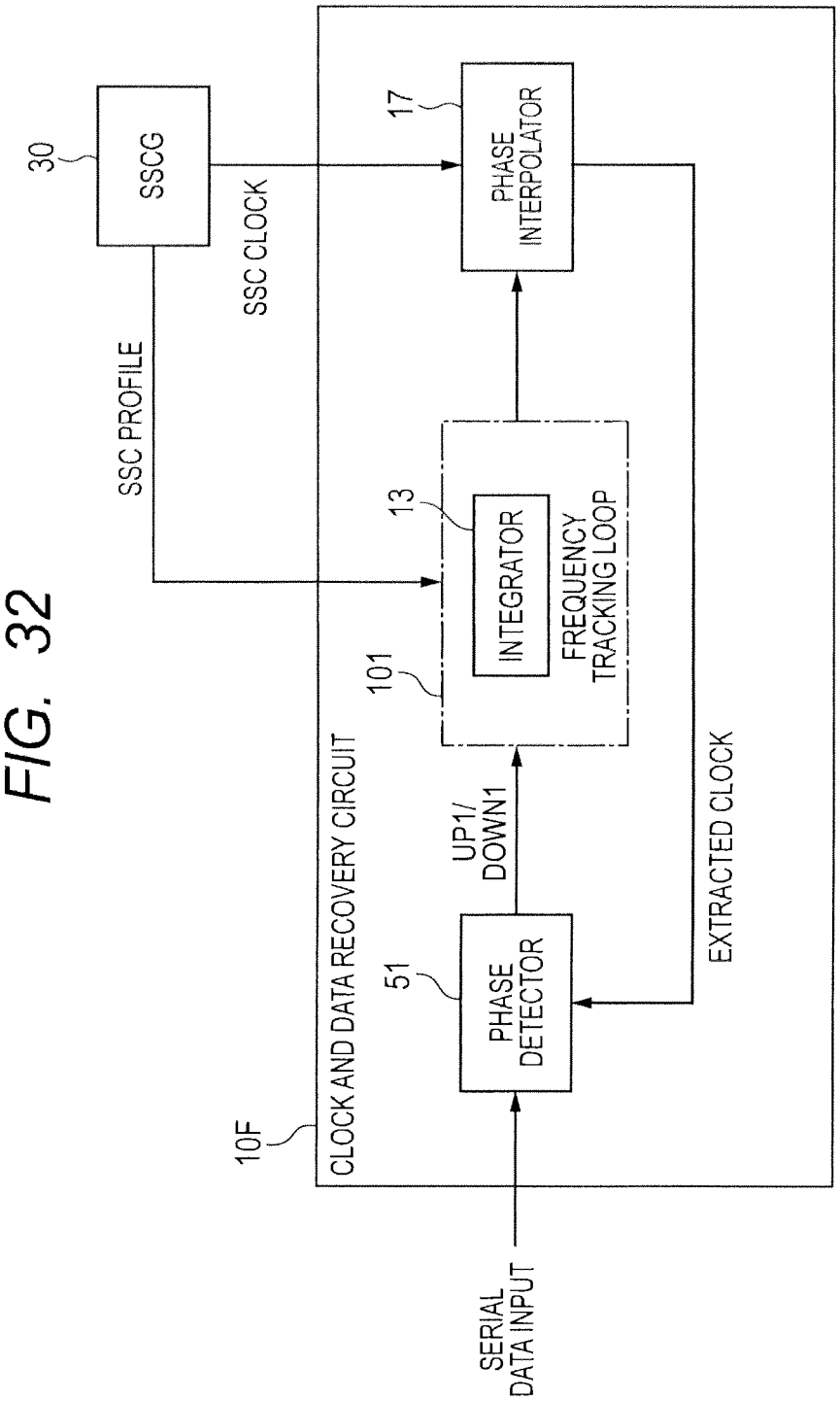
FIG. 32 is a diagram illustrating a technical feature of the embodiment.

Referring to FIG. 32 exemplifying the technical features of this embodiment, SSC profile (frequency profile) information is output from a clock generator (SSCG: spread spectrum clock generator) 130 that generates an SSC clock signal to a clock and data recovery circuit 10F. In the frequency tracking loop of the clock and data recovery circuit 10F, the frequency of the SSC clock signal is offset to provide the frequency deviation of only data (only the modulation waveform of the data is tracked in frequency), and a maximum value of the frequency deviation to be tracked is set to Δf, in the frequency deviation (=|(frequency of serial data input)−(frequency of SSC clock signal)|) to be tracked by the frequency tracking loop, with the use of the SSC profile information of the SSC clock signal. The data is data that is subjected to the spread-spectrum frequency modulation by a data source, and received by the clock recovery circuit.

That is, if a frequency variation (the amount of diffusion) of the SSC profile which is input from the SSC clock generator 130 is −X ppm, in the frequency tracking loop 101, a correction corresponding to −(−X ppm)=+X ppm is added to the frequency deviation to be tracked to offset the frequency deviation of the SSC clock signal. More specifically, if a frequency variation (the amount of diffusion) of the SSC profile is −X ppm, −(−X ppm)=+X ppm is added (or, accordingly −X ppm is) subtracted) to an output or an input of the integrator 13 in the frequency tracking loop 101 to provide 0 ppm. For example, if the frequency variation of the SSC clock signal is −5000 ppm (=0.995 f), the clock signal of the frequency 0.995 f is input to the phase interpolator 17 as the SSC clock signal. However, in the frequency tracking loop 101, in the frequency deviation to be tracked=(frequency of the serial data input)−(frequency of SSC clock signal), a frequency offset (correction) is added by +5000 ppm, and the frequency deviation to be tracked in the frequency tracking loop 101 is only the frequency variation of the serial data input that is subjected to the spread-spectrum frequency modulation.

Likewise, when the frequency variation of the SSC clock signal is −2500 ppm=0.9975 f, the SSC clock signal of the frequency 0.9975 f is input to the phase interpolator 17. However, because the frequency offset is given to the frequency tracking loop 101 by +2500 ppm, the frequency variation of the SSC clock signal apparently becomes 0 ppm, and the frequency deviation to be tracked by the frequency tracking loop 101 is only the frequency variation of the serial data input subjected to the spread-spectrum frequency modulation. That is, ideally, the frequency of the SSC clock signal, which is input from the SSC clock generator 130 to the clock and data recovery circuit 10F, can be always apparently regarded as 0 ppm in the frequency tracking loop 101. In the case where the diffusion mode of the profile of the SSC is the up diffusion instead of the down diffusion, if the frequency variation (the amount of diffusion) of the SSC profile is +X ppm, −(+X ppm)=−X ppm is added (accordingly, (+X ppm) is subtracted) to the output or the input of the integrator 13 in the frequency tracking loop 101 to provide 0 ppm.

According to this embodiment, in the frequency tracking loop of the clock and data recovery circuit, the frequency variation of the SSC clock signal is offset, and the frequency deviation is tracked on the basis of the frequency variation of the serial data input. The absolute value (|(frequency of the serial data input)−(frequency of the SSC clock)|) of the frequency deviation becomes Δf(=5000 ppm) at a maximum, and can be reduced to half of that in the configuration of FIG. 26.

The frequency tracking loop of the clock and data recovery circuit tracks 0 ppm to −5000 ppm in a cycle corresponding to the modulation frequencies 30 kHz to 33 kHz, and a load on the clock and data recovery circuit is halved to improve the characteristics (jitter tolerance characteristics) of the clock and data recovery circuit.

Since the frequency variation of the SSC clock signal input to the phase interpolator 17 is supplied from the SSC clock generator 130 (or the appropriate SSC controller of the PLL having the SSC controller), the frequency variation is always latest information. In the SSC clock generator 130, the SSC clock signal is generated and output on the basis of a variation pattern (frequency profile) of the frequency of the SSC clock signal. According to this embodiment, the frequency information of the SSC clock signal currently input to the phase interpolator 17 is supplied to the frequency tracking loop, and the phase of the extracted clock signal in the phase interpolator 17 is adjusted on the basis of the frequency information. For that reason, the characteristic deterioration caused by conducting the phase control of the extracted clock on the basis of the old information does not occur.

According to this embodiment, since the frequency deviation is suppressed to Δf at a maximum, a time rate of change of the frequency variation pattern (saw tooth wave) becomes low, the number of counts in the integrator 13 of the frequency tracking loop within the clock and data recovery circuit can be increased (resolution capability can be enhanced), and an improvement in the low-pass filter characteristics can also be expected.

Figure 2:
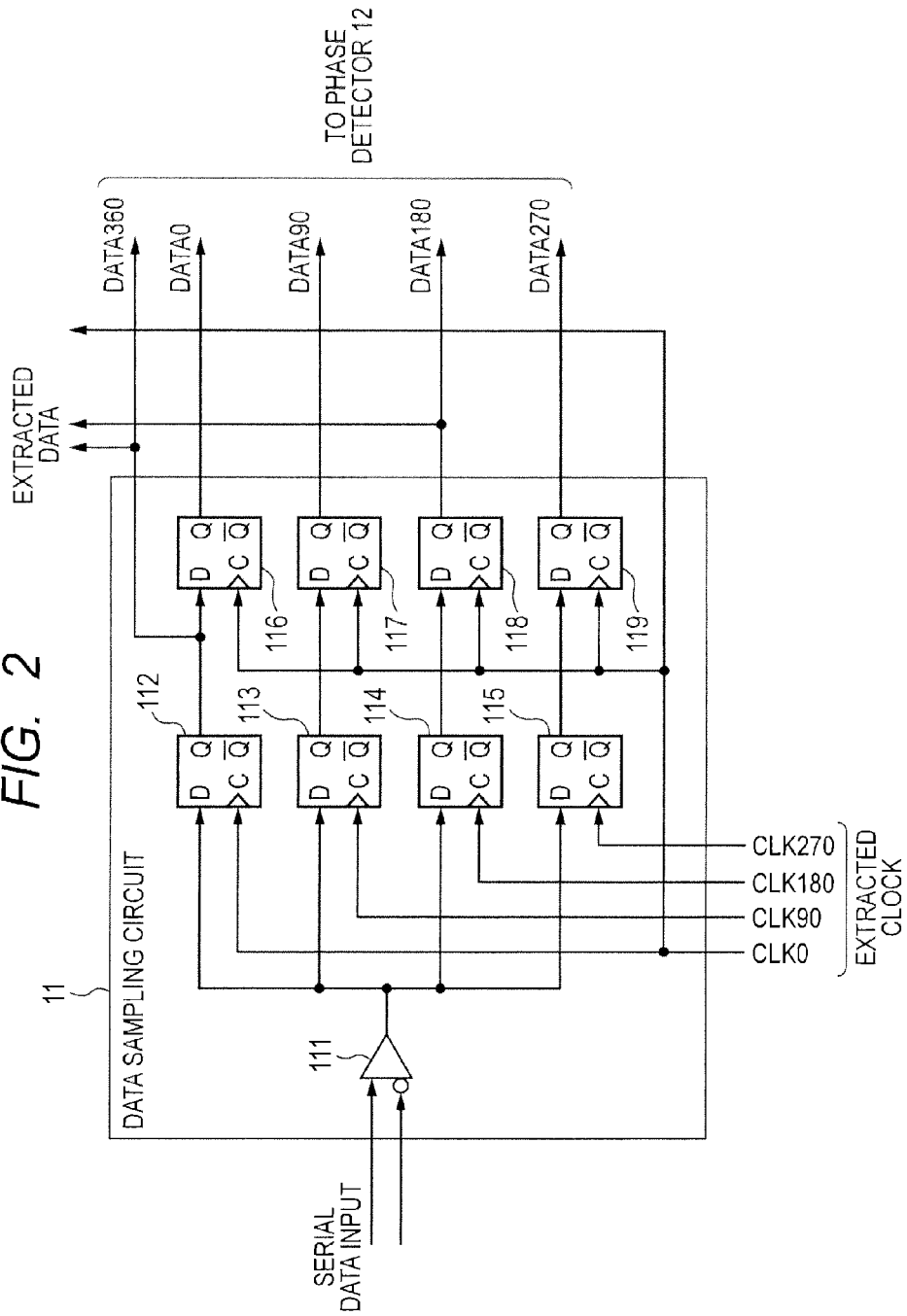
FIG. 2 is a diagram illustrating a configuration of a data sampling circuit.
Figure 3:
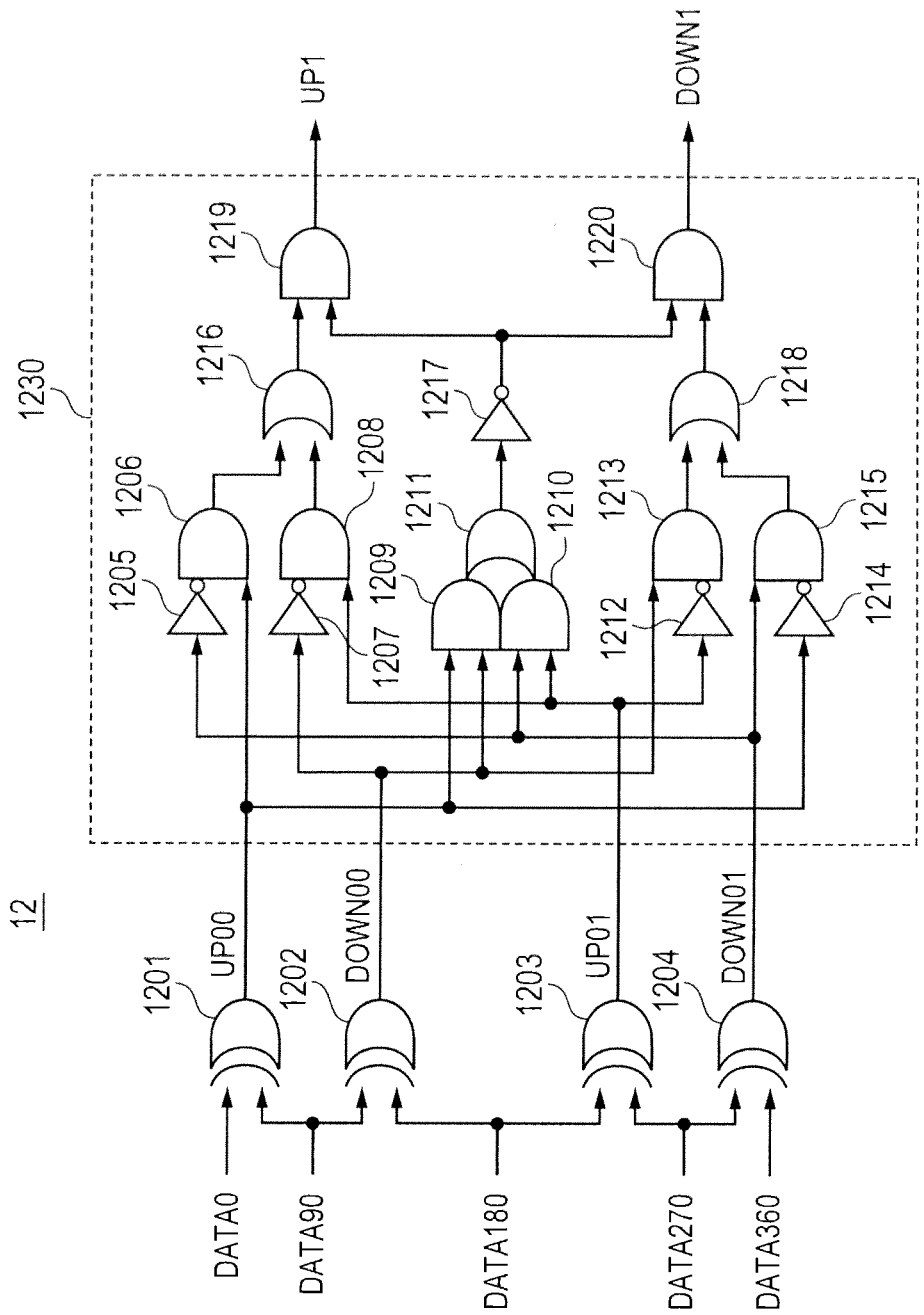
FIG. 3 is a diagram illustrating a configuration of a phase detector.

Although not particularly restricted, the SSC profile information corresponds to, for example, a signal S_UD in FIGS. 1 to 3 of Japanese Unexamined Patent Application Publication No. 2010-283830. The frequency variation is determined by S_UD, and a value of S_UD is varied to subject the SSC clock signal to the spread-spectrum frequency modulation.

In FIG. 32, the clock and data recovery circuit 10F and the SSC clock generator 130 may be formed on an identical chip. Alternatively, it is needless to say that the clock and data recovery circuit 10F and the SSC clock generator 130 may be disposed on a circuit board as respective different semiconductor chips.

FIG. 33 is a diagram illustrating an example in which an embodiment of FIG. 32 is applied to the clock and data recovery circuit described with reference to FIG. 26. Referring to FIG. 33A, the SSC clock signal from the SSC clock generator 130 is input to the phase interpolator 17 of a clock and data recovery circuit 10G, and an adder 18 is inserted between the integrator and the pattern generator 15 in FIG. 26. SSC_MOD (SSC modulation information) is input to the adder 18 as the SSC profile information output from the SSC clock generator 130. The adder 18 inputs a value obtained by adding (−SSC_MOD) to an output FDIF1 of the integrator 13 to the pattern generator 15 as FDIF2. FIG. 33B illustrates a configuration example of the SSC clock generator 130. The SSC clock generator 130 includes that an SSC controller 1301 that receives the clock signal (reference clock signal), and outputs the SSC modulation information SSC_MOD, and a phase interpolator 1302 that changes phase of the clock signal on the basis of the SSC modulation information from the SSC controller 1301, and outputs the SSC clock signal that has been frequency modulated. In FIG. 33, an output of the integrator 13 in the frequency tracking loop is corrected by the SSC_MOD. Alternatively, an input of the integrator 13 may corrected by SSC_MOD. Hereinafter, several embodiments will be described.

First Embodiment

FIG. 1 is a diagram illustrating a configuration of a clock and data recovery circuit according to a first embodiment. In the first embodiment of FIG. 1, the SSC clock signal is supplied from the PLL 30 as the above-mentioned clock and data recovery circuit compliant with the serdes. The PLL 30 corresponds to the SSC clock generator 130 in FIGS. 32 and 33A, 33B. In FIG. 1, loops are configured in which a signal is again returned to a data sampling circuit 11 through the data sampling circuit 11, a phase detector 12, and the phase interpolator 17. Among those loops, a loop including a path that passes the mixer 16 through the phase detector 12, the integrator 13, the adder 18, and the pattern generator 15 configures the frequency tracking loop 101. On the other hand, a loop including a path that passes the mixer 16 through the phase detector 12 and the integrator 14 configures a phase tracking loop 102. Also, unlike the configuration of FIG. 1 is different from the configuration of FIG. 26 described above, the configuration of FIG. 1 receives the spread-spectrum frequency modulation (SSC modulation information: SSC_MOD) of the PLL clock signal, and adds a value obtained by inverting a sign of the SSC_MOD to an output FDIF1 of the integrator 13 by the adder 18 disposed within the frequency tracking loop 101. In the following embodiment, the PLL 30 may be replaced with the SSC clock generator 130 in FIG. 32.

In FIG. 1, the data sampling circuit 11 is illustrated as a configuration different from the phase detector 12. This is because the extracted clock signal and the extracted data are clearly specified in the clock and data recovery circuit. It is needless to say that a circuit block that brings the data sampling circuit 11 and the phase detector 12 into one circuit block may be formed of a phase detector (identical with the phase detection unit 51 in FIGS. 26, and 33A, 33B). In the above-mentioned FIGS. 26, 32, and 33A, 33B, a function (data sampling circuit 11 in FIG. 1) that samples data is provided in the phase detection unit 51.

Also, an output of the integrator 13 within the frequency tracking loop is UPDOWN3 in FIG. 26, whereas the output is FDIF1 (magnitude of frequency deviation) in FIG. 1.

The clock and data recovery circuit 10A includes the data sampling circuit 11, the phase detector 12, the integrator 13, the integrator 14, the pattern generator 15, the mixer 16, the phase interpolator 17, and the adder 18. The frequency tracking loop 101 is designed to detect the frequency deviation between the serial data input and the PLL clock, and conduct the phase control in proportion to the detected frequency deviation as described above. Also, the phase tracking loop 102 is designed to detect the phase relationship (advance or retard) between the serial data input and the PLL clock, and conduct the phase control according to the detected phase relationship. The phase tracking loop 102 is designed to track the phase variation of the serial data input unlike the frequency tracking loop 101.

The data sampling circuit 11 samples the input data according to multiphase extracted clock signal from the phase interpolator 17, and outputs the data in synchronization with a clock signal of any one phase among the multiphase clock signals. The following embodiment exemplifies a configuration in which the data is sampled according to a four-phase clock signal. However, it is needless to say that this embodiment is not limited to the four-phase clock signal.

(Data Sampling Circuit 11)

FIG. 2 is a diagram illustrating an example of the configuration of the data sampling circuit 11. In a configuration of FIG. 2, the clock signal frequency is ½ of the data frequency. For example, if the data is 5 Gbps (Giga bits per second), the clock signal becomes the four-phase clock signals CLK0, CLK90, CLK180, and CLK270 having a frequency of 2.5 GHz. If the frequency of the clock signal is ½ of the data frequency, the data sampling circuit 11 outputs two sampled data (for example, sample values in the center of the data signal according to CLK0 and CLK180) as the extracted data together with the extracted clock signal from the clock and data recovery circuit to another circuit.

The data sampling circuit 11 includes a receiver 111 that differentially receives data inputs, and outputs a data signal at a single end, flip-flops 112, 113, 114, and 115 that receive an output signal of the receiver 111 at respective data terminal (D), receive the four-phase clock signals CLK0, CLK90, CLK180, and CLK270 at respective clock signal terminals (C), and sample and output the signals of the data terminals (D) at rising edges of the clock signals CLK0, CLK90, CLK180, and CLK270, and flip flops 116, 117, 118, and 119 that receive outputs from output terminals (Q) of the corresponding flip flops 112, 113, 114, and 115 at respective data terminals (D), receive the clock signal CLK0 at respective clock signal terminals (C), and sample the signals of the data terminals (D) at the rising edge of the clock signal CLK0. It is assumed that output signals from the output terminals (Q) of the flip flops 116, 117, 118, and 119 are DATA0, DATA90, DATA180, and DATA270, and an output signal from the output terminal (Q) of the flip flop 112 is DATA360.

Two data DATA360 and DATA180 are output as the extracted data, and data DATA0, DATA90, DATA180, DATA270, and DATA360 of 4+1=5 are supplied to the phase detector 12.

In a state where the clock and data recovery circuit is locked, the clock signals CLK0 and CLK180 sample the center of the data signal, and the clock signals CLK90 and CLK270 sample a change point (edge) of the data signal.

If the frequency of the clock signal is ½ of the data frequency, the data sampling circuit 11 outputs two pieces of sampled data (for example, sample values in the center of the data signal according to CLK0 and CLK180) as the extracted data together with the extracted clock signal from the clock and data recovery circuit to another circuit (a circuit that processes the extracted data according to the extracted clock signal).

In general, if the clock signal frequency is 1/n of the data frequency, the clock signal is of 2×n phases. The data sampling circuit 11 outputs (2×n+1) data to the phase detector 12, and outputs n data as the extracted data together with the extracted clock signal from the clock and data recovery circuit to another circuit. As illustrated in FIG. 2, if the clock signal frequency is ½ of the data frequency, the clock signal is of 2×2 phases=4 phases. The data sampling circuit 11 outputs (2×2+1)=5 data to the phase detector 12, and outputs two extracted data.

(Phase Detector 12)

FIG. 3 is a diagram illustrating an example of the configuration of the phase detector 12 in FIG. 1. The phase detector 12 compares adjacent data of the data DATA0, DATA90, DATA180, DATA270, and DATA360 output from the data sampling circuit 11 with each other by two-input EXOR circuits 1201, 1202, 1203, and 1204. As data adjacent to the data DATA270 sampled in the fourth-phase clock signal CLK270, the data DATA360 sampled by the clock signal CLK360, that is, CLK0 in a subsequent cycle is cyclically compared by the two-input EXOR circuit 1204. The two-input EXOR circuit outputs 0 when the two inputs match each other, and 1 when the two inputs do not match each other. The outputs of the EXOR circuits 1201, 1202, 1203, and 1204 become UP00, DOWN00, UP01, and DOWN01.

Referring to FIG. 3, the phase detector 12 further includes a logic circuit unit 1230 having:

an inverter 1205 that receives the DOWN01;
an inverter 1207 that receives the DOWN00;
an inverter 1212 that receives the UP01;
an inverter 1214 that receives the UP00;
a two-input AND circuit 1206 that receives the UP00 and an output of the inverter 1205;
an AND circuit 1208 that receives the UP01 and an output of the inverter 1207;
a two-input AND circuit 1209 that receives the UP00 and the DOWN00;
a two-input AND circuit 1210 that receives the UP01 and the DOWN01;
a two-input AND circuit 1213 that receives the DOWN00 and an output of the inverter 1212;
a two-input AND circuit 1215 that receives the DOWN01 and an output of the inverter 1214;
a two-input OR circuit 1216 that receives the outputs of the AND circuits 1206 and 1208;
a two-input OR circuit 1211 that receives the outputs of the AND circuits 1209 and 1210;
a two-input OR circuit 1218 that receives the outputs of the AND circuits 1213 and 1215;

an inverter 1217 that receives the output of the OR circuit 1211;

a two-input AND circuit 1219 that receives the outputs of the OR circuit 1216 and the inverter 1217; and a two-input AND circuit 1220 that receives the outputs of the OR circuit 1218 and the inverter 1217.

The logic circuit unit 1230 receives UP00, DOWN00, UP01, and DOWN01, and outputs UP1 and DOWN1.

Reference numerals 1201 to 1204 are EXORs that compare the sampled data, and 1205 to 1220 perform the majority of UP00, DOWN00, UP01, and DOWN01.

If UP00+UP01>DOWN00+DOWN01, UP1=1 and DOWN1=0 are met.

If UP00+UP01<DOWN00+DOWN01, UP1=0 and DOWN1=1 are met.

In the other cases, UP1=0 and DOWN1=0 are met.

Because UP1 and DOWN1 are too high in speed, a DEMUX circuit or (DEMUX+majority circuit) may be added at a rear stage to decrease the speed.

FIG. 4 illustrates logic of the above-mentioned logic circuit unit 1230 as a true table in a lump. When the clock and data recovery circuit is locked, UP00=1 and DOWN00=1 are not met.

Also, UP01=1 and DOWN01=1 are not met. In those two cases, UP1=DOWN1=0 is output. The other cases perform the majority of UP00, DOWN00, UP01, and DOWN0. If the number of UP is larger, UP1=1 and DOWN1=0 are output, and if the number of DOWN is larger, UP1=0 and DOWN1=1 are output.

If UP00=DOWN00=1, UP1=DOWN1=0 is met.

If UP01=DOWN01=1, UP1=DOWN1=0 is met.

The other cases perform the majority of UP00, DOWN00, UP01, and DOWN01. If the number of UP is larger, UP1=1 and DOWN1=0 are output, and if the number of DOWN is larger, UP1=0 and DOWN1=1 are output.

(Operation Example when DOWN Occurs)

Subsequently, a description will be given of a case in which the phase of the extracted clock signal is more advanced than the data, and DOWN occurs.

Figures 5A, 5B:
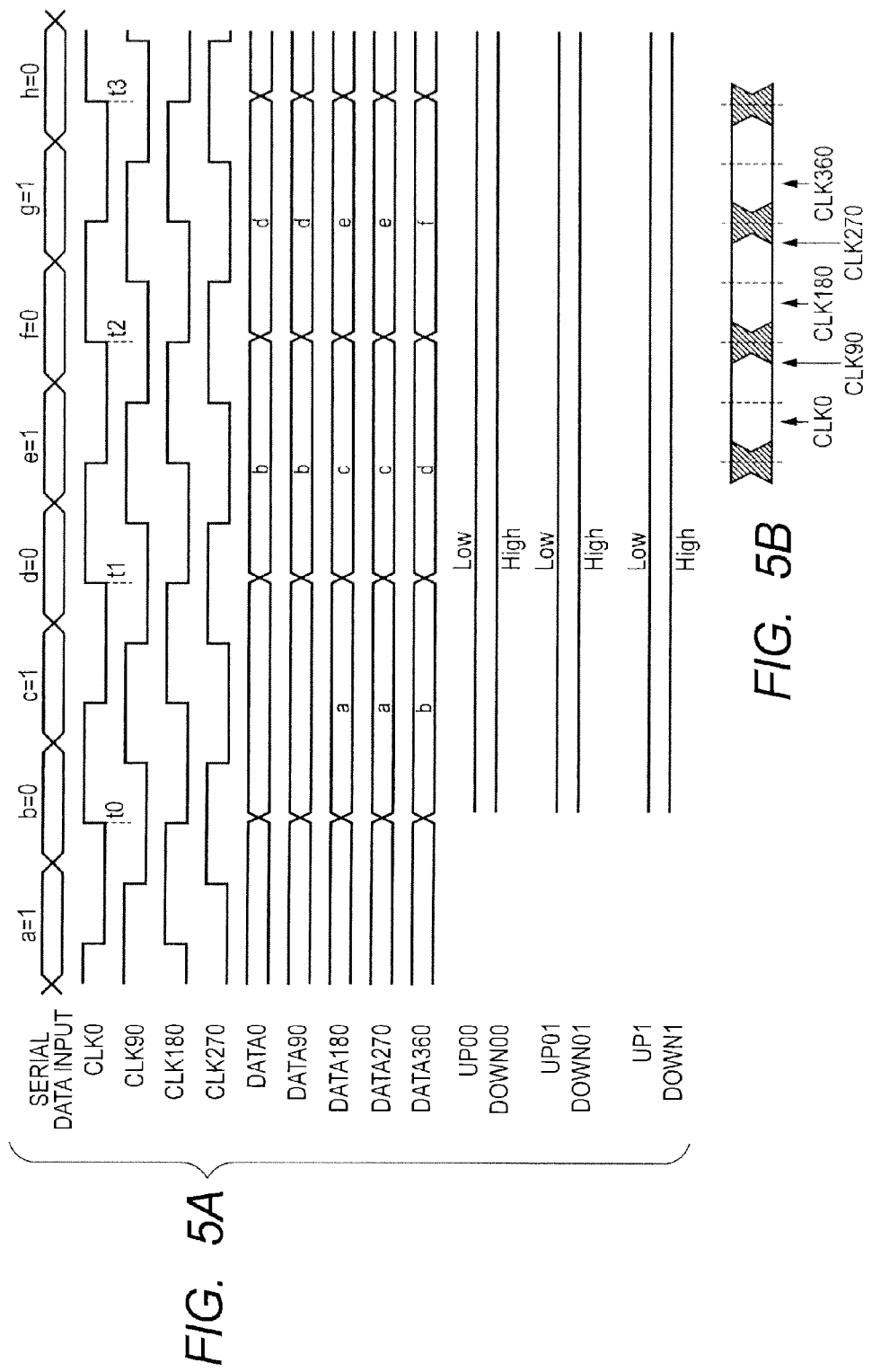
FIGS. 5A and 5B are diagrams illustrating an operation example of the data sampling circuit and a phase comparator.

FIGS. 5A and 5B are diagrams illustrating the operation of the data sampling circuit 11 and the phase detector 12 in FIG. 1. FIGS. 5A and 5B are timing charts illustrating the operation example when DOWN1=1(=High) is met.

FIG. 5A illustrates voltage waveforms of data input, the clock signals CLK0, CLK90, CLK180, CLK270, the sampling data DATA0, DATA 90, DATA 180, DATA 270, DATA 360, UP00, DOWN00, UP01, DOWN01, UP1, and DOWN1. Although not particularly restricted, in the following timing chart, it is assumed that high is logic 1, and low is logic 0. FIG. 5B is a waveform diagram illustrating a phase relationship between the extracted clock signal and the data signal. CLK0 and CLK180 should come to data center portions indicated by dashed lines adjacent to the respective arrow lines on the right, but are advanced in phase. CLK90 and CLK270 should come to data edges indicated by the respective adjacent dashed lines on the right, but are advanced in phase.

Referring to FIG. 5A, it is assumed that a=1, b=0, c=1, d=0, e=1, f=0, g=1, and h=0 are input as the data input at a frequency twice as high as the clock signal frequency in the stated order. Also, it is assumed that z=0 (≠a) is input before a=1.

At the rising (timing t0) of the CLK0, z, z, a, and a sampled at the rising edges of CLK0, CLK90, CLK180, and CLK270 in a last cycle, respectively, and b sampled at the rising of the present CLK0 (that is, CLK360) are output in parallel, to DATA0, DATA 90, DATA 180, DATA 270, and DATA 360 (DATA360 is data sampled by the clock signal (CLK360) retarded by one clock signal cycle (360 degrees) from CLK0). As a result, UP00, DOWN00, UP01, and DOWN01 become low, high, low, and high, respectively, and UP1 and DOWN1 become low and high, respectively. The output DOWN00 of the EXOR 1202 that compares z and a of DATA90 and DATA180 with each other, and the output DOWN01 of the EXOR 1204 that compares a and b of DATA270 and DATA360 with each other become high, and UP00 and UP01 become low.

Accordingly, DOWN1=1 is met. The same is applied to the subsequent operation. In this case, the phase of the extracted clock signal is retarded.

(Operation Example When UP occurs)

Subsequently, a description will be given of a case in which the extracted clock signal phase is retarded, and UP occurs.

Figures 6A, 6B:
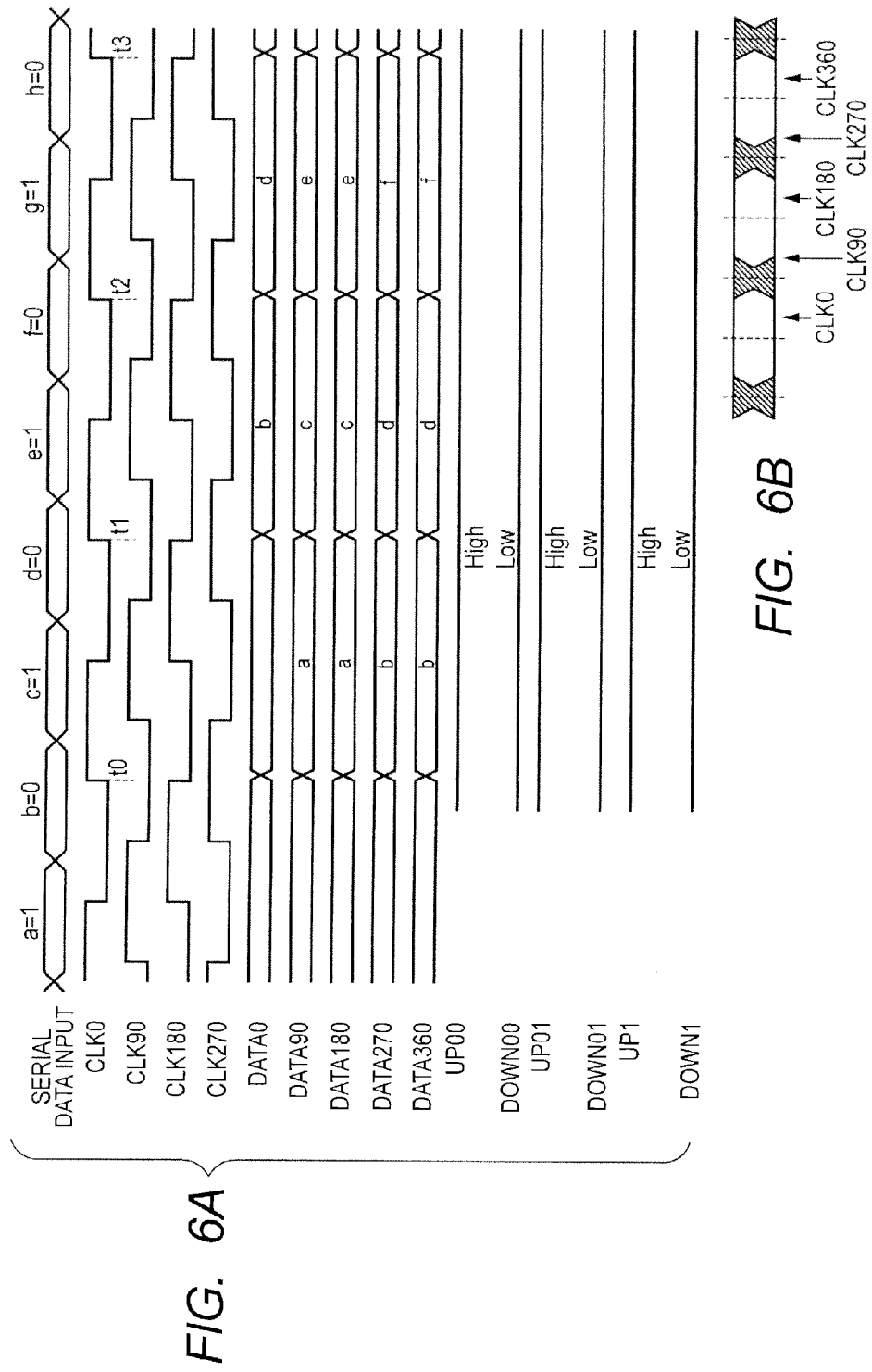
FIGS. 6A and 6B are diagrams illustrating an operation example of the data sampling circuit and the phase comparator.

FIGS. 6A and 6B are timing charts illustrating the operation example when UP1=High is met. FIG. 6A illustrates voltage waveforms of data input, CLK0, CLK90, CLK180, CLK270, DATA0, DATA 90, DATA 180, DATA 270, DATA 360 (DATA360 is data sampled by the clock signal (CLK360) retarded by one clock signal cycle (360 degrees) from CLK0), UP00, DOWN00, UP01, DOWN01, UP1, and DOWN1. It is assumed that high is logic 1, and low is logic 0.

FIG. 6B is a waveform diagram illustrating a phase relationship between the extracted clock signal and the data signal. CLK0 and CLK180 should come to data center portions indicated by dashed lines adjacent to the respective arrow lines on the left, but are retarded in phase. CLK90 and CLK270 should come to data edges indicated by the respective adjacent dashed lines on the left, but are retarded in phase.

Referring to FIG. 6A, it is assumed that a=1, b=0, c=1, d=0, e=1, f=0, g=1, and h=0 are input at a frequency twice as high as the clock signal frequency in the stated order. Also, it is assumed that z=0 (≠a) is input before a=1.

At the rising (timing t0) of the CLK0, z, a, a, and b sampled at the rising edges of CLK0, CLK90, CLK180, and CLK270 in a last cycle, respectively, and b sampled at the rising of the present CLK0 are output in parallel, to DATA0, DATA 90, DATA 180, DATA 270, and DATA 360. As a result, UP00, DOWN00, UP01, and DOWN01 become high, low, high, and low, respectively, and UP1 and DOWN1 become high and low, respectively. The output UP00 of the EXOR 1201 that compares z and a of DATA0 and DATA90 with each other becomes 1, the output UP01 of the EXOR 1203 that compares a and b of DATA180 and DATA270 with each other become high, and DOWN00 and DOWN01 become low. Accordingly, UP1=1 is met. The same is applied to the subsequent operation. In this case, the phase of the extracted clock signal is advanced.

(State Transition Example of Integrator 14 (UP/DOWN Counter))

The integrator 14 within the phase tracking loop 102 includes an UP/DOWN counter (not shown) that receives UP1 and DOWN1 from the phase detector 12, counts up when UP1=high is met, and counts down when DOWN1=high is met.

Figure 7:
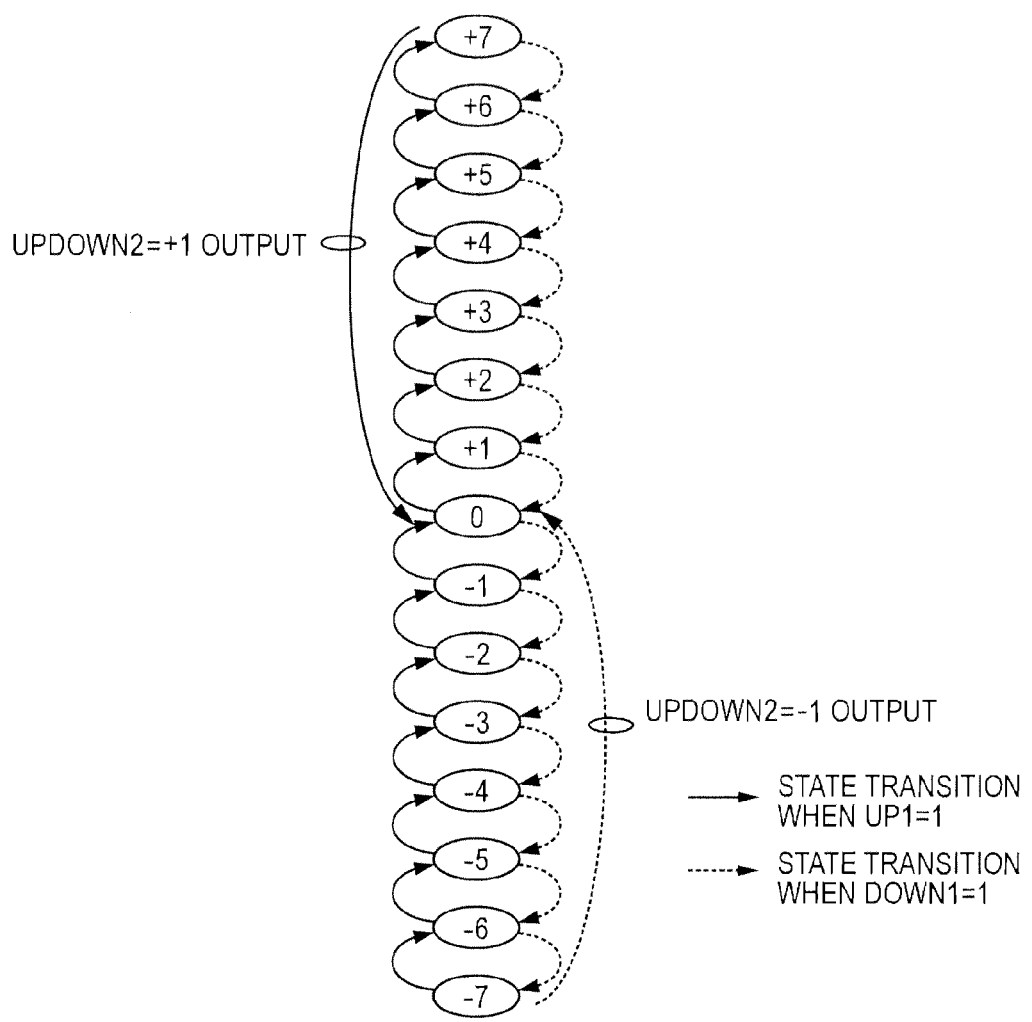
FIG. 7 is a diagram illustrating an operation example of an integrator in a phase tracking loop.

FIG. 7 is a state transition diagram of the UP/DOWN counter of the integrator 14 within the phase tracking loop 102. Solid lines represent the state transition when UP1=1, and dashed lines represent the state transition when DOWN1=1 is met. When UP1=1 is met, the UP/DOWN counter increments the count value by one in response to the clock signal input, and when DOWN1=1 is met, the UP/DOWN counter decrements the count value by one in response to the clock signal input. When the count value of the present cycle is +7, if UP1=1 is met, the count value returns to 0 from +7. In this situation, the UP/DOWN counter outputs UPDOWN2=+1. When the count value of the present cycle is −7, if DOWN1=1 is met, the count value returns to 0 from −7. In this situation, the UP/DOWN counter outputs UPDOWN2=−1.

The integrator 14 outputs UPDOWN2=+1 at the time when the number of UP1 becomes larger than the number of DOWN1 by eight, and outputs UPDOWN2=−1 when the number of DOWN1 becomes larger than the number of UP1 by eight.

The integrator 14 is designed to stabilize the clock and data recovery circuit. If no integrator is provided, the phase of the extracted clock signal is frequently moved with the use of UP1/DOWN1 output by the phase detector 12, and the phase of the extracted clock signal is not stabilized.

(Configuration Example of Integrator 13)

Figure 8:
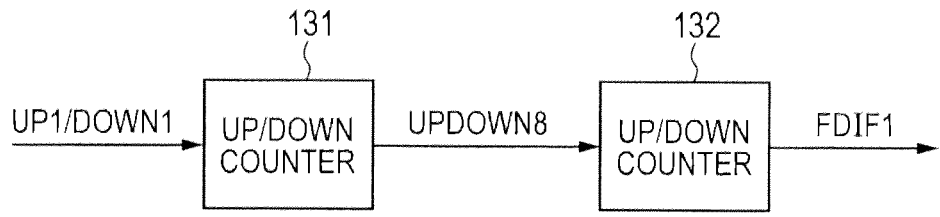
FIG. 8 is a diagram illustrating an example of a conjuration of the integrator in a frequency tracking loop.

FIG. 8 is a diagram illustrating an example of the configuration of the integrator 13 in the frequency tracking loop. As illustrated in FIG. 8, the integrator 13 includes two UP/DOWN counters 131 and 132. The first UP/DOWN counter 131 is identical in configuration with the UP/DOWN counter of the integrator 14 within the phase tracking loop 102. The UP/DOWN counter 131 is an UP/DOWN counter provided not to update the frequency deviation information each time by UP1/DOWN1 output by the phase detector 12, but to update the frequency deviation information only when the number of UP and DOWN increases by a given number. When the frequency deviation information is updated each time by the UP1/DOWN1, the first UP/DOWN counter 131 is not used.

The second UP/DOWN counter 132 is identical in configuration with the UP/DOWN counter of the integrator 14 within the phase tracking loop 102. However, the FDIF1 that is a counter value is proportional to the frequency deviation (frequency deviation detected by the frequency tracking loop within the clock and data recovery circuit). The UP/DOWN counter 132 automatically resets the count value to 0, or maintains the count value at a maximum value or a minimum value, when overflow or underflow occurs.

(Configuration Example of Pattern Generator 15)

Figure 9:
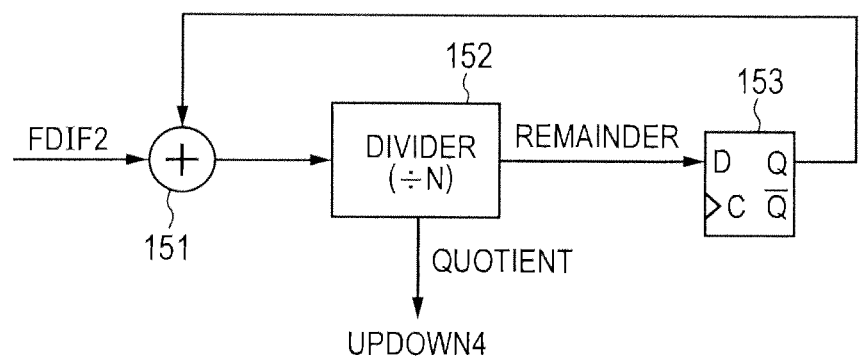
FIG. 9 is a diagram illustrating an example of a configuration of a pattern generator.

FIG. 9 is a diagram illustrating an example of the configuration of the pattern generator 15 in FIG. 1. Referring to FIG. 9, the pattern generator 15 includes an adder 151 that receives the FDIF2, a divider 152 that divides an output of the adder 151 by N, and outputs a quotient as an output signal UPDOWN4, and a flip flop 153 that receives a remainder from the divider 152, and samples the remainder in response to the clock signal. An output signal (remainder) of an output terminal (Q) of the flip flop (FF) 153 is fed back to the adder 151, and added to FDIF2. FDIF2 is an output of the adder 18, which is a signal obtained by adding a sign inversion of SSC_MOD to the output FDIF1 of the integrator 13. The flip flop (FF) 153 is configured by the number of bits (6 bits if a maximum value of the remainder is 63) necessary to express the remainder.

The frequency deviation FDIF2 is added, divided by N, and the quotient is output as the UPDOWN4, and the remainder is held by the flip flop (FF) 153. The remainder is again added to FDIF2 in a subsequent clock signal cycle. As an example, the operation of N=64 will be described.

In the case of FDIF2=1, the output of the flip flop 153 are incremented by one in the stated order of 0, 1, . . . , 63, and the addition result of the output (remainder) of the flip flop 153 and FDIF2 becomes 64 in the subsequent clock signal. Therefore, the divider 152 outputs UPDOWN4=1, and the value of the flip flop 153 becomes 0. Accordingly, UPDOWN4=+1 is output with a probability of once in 64 clock cycles.

If the case of FDIF2=2, the output of the flip flop 153 are incremented by two in the stated order of 0, 2, 4, . . . , 62, and the addition result of the output (remainder) of the flip flop 153 and FDIF2 becomes 64 in the subsequent clock signal. Therefore, the divider 152 outputs UPDOWN4=1, and the value of the flip flop 153 becomes 0. Accordingly, UPDOWN4=+1 is output with a probability of twice in 64 clock signals.

In the case of FDIF2=−1, the output of the flip flop 153 is decremented by one in the stated order of 0, −1, −2, . . . , −63, and the addition result of the output (remainder) of the flip flop 153 and FDIF2 becomes −64 in the subsequent clock signal. Therefore, the divider 152 outputs UPDOWN4=−1, and the value of the flip flop 153 becomes 0. Accordingly, UPDOWN4=−1 is output with a probability of once in 64 clock signals.

As described above, in general, if 0<FDIF2<N is met, UPDOWN4=+1 is output with a probability of FDIF2/N, and if 0>FDIF2>−N is met, UPDOWN4=−1 is output with a probability of −FDIF2/N.

A range of FDIF2 is not limited to −N<FDIF2<N.

If FDIF2>=N is met, UPDOWN4 becomes FDIF2 div N, or FDIF2 div N+1.

A probability with which FDIF2 div N+1 is output is (FDIF2 mod N)/N.

The div and mod of FDIF2 div N and FDIF2 mod N are the quotient and the remainder of the division of an integer (FDIF2 is divided by N), respectively. The same is applied to a case of FDIF2<=−N.

In the pattern generator 15, UPDOWN4 is proportional to FDIF2.

(Configuration Example of Mixer 16)

Figure 10:
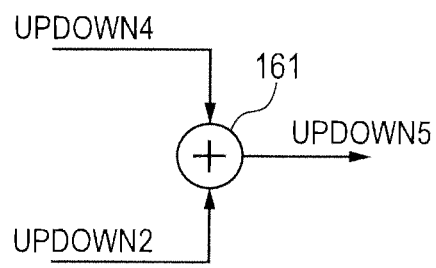
FIG. 10 is a diagram illustrating an example of a configuration of a mixer.

As illustrated in FIG. 10, the mixer 16 in FIG. 1 includes an adder 161 that adds the output signal UPDOWN4 of the pattern generator 15 and the output signal UPDOWN2 of the integrator 14 together, and outputs an addition result as the UPDOWN5.

(Phase Interpolator 17)

The phase interpolator 17 includes an interpolator that receives the PLL clock signal, and outputs the extracted clock signal (multiphase clock signal). As illustrated in FIG. 11, when UPDOWN5=+1 is input from the mixer 16, the phase of the extracted clock signal is advanced by 1 step, and when UPDOWN5=−1 is input therefrom, the phase is retarded by 1 step. When UPDOWN5=+2 is input therefrom, the phase is advanced by 2 steps.

In the example illustrated in FIG. 11, the phase interpolator 17 receives four-phase clock signals (0 degrees, 90 degrees, 180 degrees, and 270 degrees) as the input clock signal, receives the UPDOWN5 as a control signal, and outputs the extracted clock signals CLK0, CLK90, CLK180, and CLK270 (refer to FIG. 2) in which the phase is interpolated.

In FIG. 11, one clock signal (for example, CLK0) of the fourth-phase clock signals is illustrated as the extracted clock signal. The CLK90, CLK180, and CLK270 are also controlled in phase in the same manner. The phase interpolator 17 that generates the multiphase clock signals (four-phase clock signals) whose phases are adjusted from the input clock signal is configured, for example, as disclosed in FIGS. 2 and 4 of Japanese Unexamined Patent Application Publication No. 2001-273048.

(Adder 18)

The adder 18 adds the FDIF1 input from the integrator 13, and a value obtained by inverting a sign of the spread-spectrum frequency variation SSC_MOD of the PLL clock signal input from the PLL 30, and outputs an addition result as FDIF2.

(PLL 30)

The PLL 30 outputs the PLL clock signal subjected to the spread-spectrum frequency modulation, and an SSC profile (spread-spectrum frequency variation) SSC_MOD thereof. The PLL clock signal is input to the phase interpolator 17, and the spread-spectrum frequency variation SSC_MOD is input to the adder 18.

(Frequency Deviations FDIF1 and FDIF2)

The frequency deviation amount is calculated for each of FDIF1 and FDIF2. As an example, the following conditions will be described.

(Condition 1)

Data rate: 5.0 [Gbps];

PLL clock signal: clock signal (SSC clock signal) subjected to spread-spectrum frequency modulation at 2.5 [GHz];

Output signal frequency of phase detector 12 (=operating frequency of integrators 13, 14, pattern generator 15, mixer 16, and adder 18): 1.25 [GHz];

Resolution capability of phase interpolator 17: 1 step corresponds to $\frac{1}{32}$ of received data 1UI (unit interval);

Division N=25 of pattern generator 15 (FIG. 9)

Under the above conditions, when FDIF2=1 is met, the output UPDOWN4 of the pattern generator 15 outputs +1 with a probability of once in 25 cycles of the clock signal at 1.25 GHz (corresponding to ¼ of data rate).

With UPDOWN4=+1, the phase of the extracted clock signal from the phase interpolator 17 is shifted by ($\frac{1}{32}$) UI which is the resolution capability (1 step) of the phase interpolator 17.

Therefore, UPDOWN4 corresponding to the frequency deviation of $(\frac{1}{4}) \times (\frac{1}{25}) \times (\frac{1}{32}) \times 1000000 = 312.5$ [ppm] per FDIF2=1 occurs.

When FDIF2=2 is met, the output UPDOWN4 of the pattern generator 15 outputs +1 with a probability of twice in 25 cycles of the clock signal at 1.25 GHz (corresponding to ¼ of data rate). Since the frequency of UPDOWN4 is twice, 312.5×2=625 ppm is met.

As described above, FDIF2 corresponds to the frequency deviation of the PLL clock signal and the serial data.

Likewise, the frequency deviation per FDIF1=1 is 312.5 ppm.

Figure 12A:
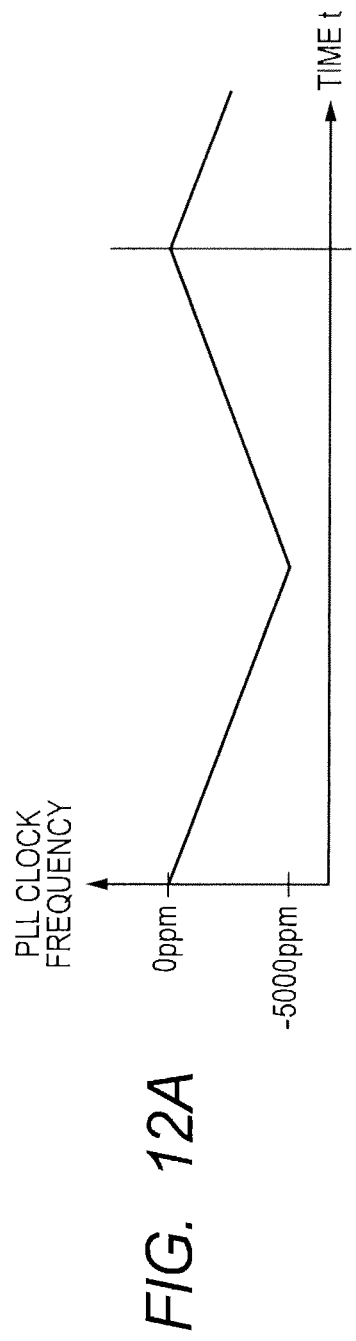
FIGS. 12A and 12B are diagrams illustrating an example of a spread-spectrum frequency variation.
Figure 12B:
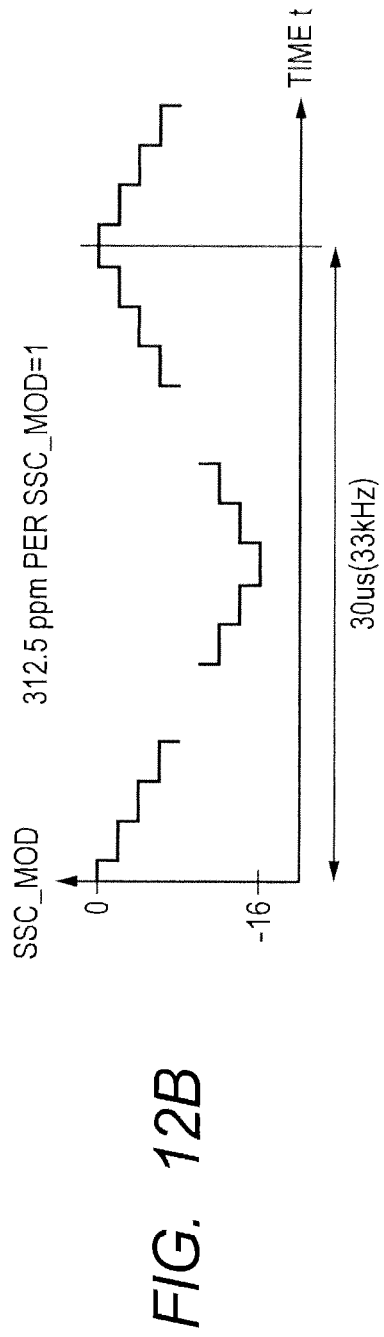

SSC_MOD is spread-spectrum frequency modulation of the PLL clock signal. It is assumed that SSC_MOD is a digital value, and like FDIF1 and FDIF2, the frequency deviation per SSC_MOD=1 is 312.5 ppm. As illustrated in FIG. 12B, SSC_MOD is changed in correspondence with a frequency variation pattern (frequency profile) of the PLL clock signal in FIG. 12A (variation pattern of a chopping waveform (saw tooth wave) that is reduced from 0 ppm to −5000 ppm, and thereafter returns to 0 ppm in a cycle of 30 μsec (33 kHz)).

SSC_MOD is reduced from 0 to −16, and then returned to 0 in the cycle 30 μsec (33 kHz) in correspondence with the frequency variation pattern (frequency profile) of the PLL clock signal (32 steps).

(SSC Profile Information: Generation of SSC_MOD)

Figure 29:
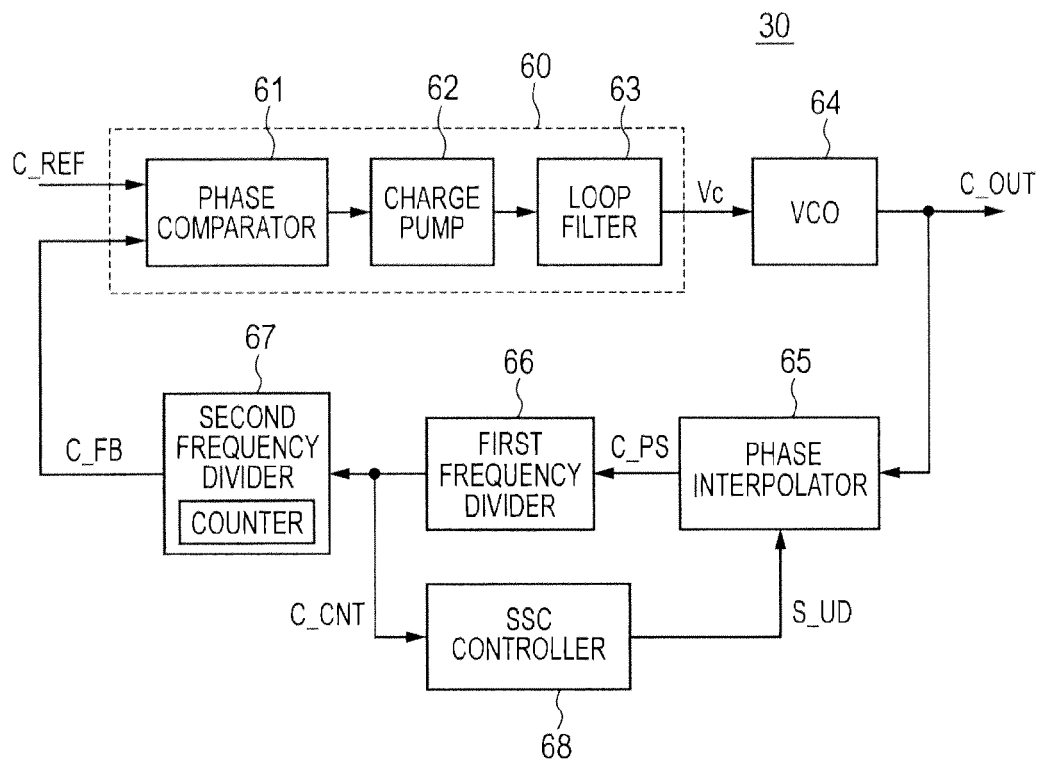
FIG. 29 is a diagram illustrating a configuration of an SSC generation PLL in the related art.
Figure 30:
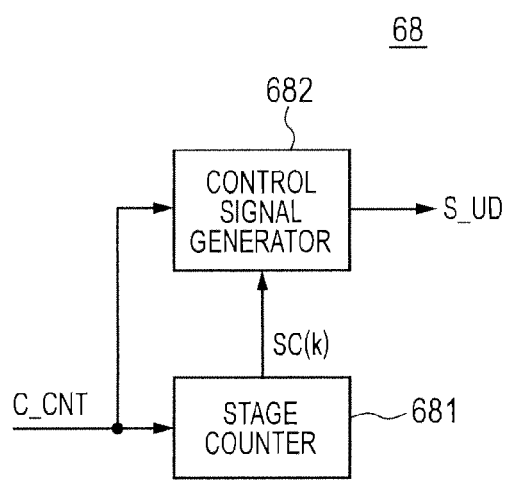
FIG. 30 is a diagram illustrating a configuration of an SSC controller of the SSC generation PLL in the related art.
Figure 31:
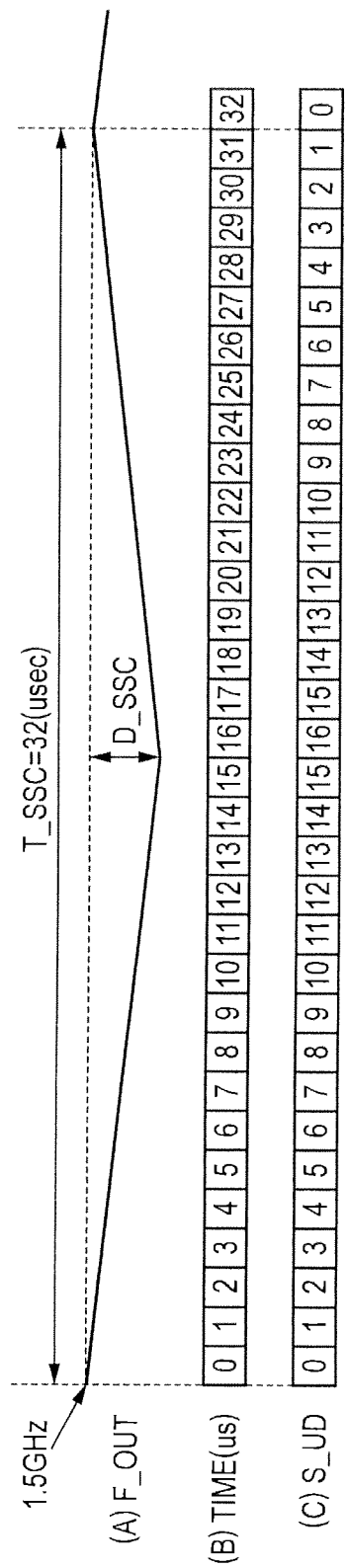
FIG. 31 is a diagram illustrating the operation of the SSC generation PLL in the related art.

Subsequently, the generation of SSC_MOD will be described. FIGS. 29, 30, and 31 are diagrams corresponding to FIGS. 1, 2, and 3 of Japanese Unexamined Patent Application Publication No. 2010-283830, respectively (reference numerals are different). FIG. 29 is a diagram illustrating an example of a configuration of the PLL having an SSC generation function. The outline of the operation of the PLL for generating the PLL clock signal C_OUT subjected to the spread-spectrum frequency modulation is described below.

(PLL with SSC function)

The PLL 30 according to the first embodiment is configured, for example, as illustrated in FIG. 29. Referring to FIG. 29, the PLL includes a phase comparison unit 60 having a phase comparator 61, a charge pump 62 that charges and discharges a capacitor with a current on the basis of a comparison result of the phase comparator 61, and a loop filter 63 that smooths a capacitor voltage, and a VCO (voltage controlled oscillator) 64 that makes an oscillating frequency variable on the basis of an output voltage from the loop filter 63. Further, a phase interpolator 65 arranged on a feedback path between the VCO 64 and the phase comparison unit 60 advances or retards the phase of an output clock signal C_OUT of the VCO 64, to thereby cyclically increase or decrease a phase difference between a feedback clock signal C_FB input to the VCO 64 and a reference clock signal C_REF.

With a cyclic variation of the phase difference, a control signal Vc to be supplied to the VCO 64 from the phase comparison unit 60 is cyclically increased or decreased, and a frequency of the output clock signal C_OUT is cyclically modulated. An output of the VCO 64 is input to the phase interpolator 65, and an output C_PS of the phase interpolator 65 is input to a first frequency divider 66, and divided. An output of the first frequency divider 66 is input to a second divider (configured by a counter), and an output C_FB of a second frequency divider 67 is input to the phase comparator 61. An output of the first frequency divider 66 is input to an SSC controller 68, and an output S_UD of the SSC controller 68 is input to the phase interpolator 65.

(SSC Controller)

The SSC controller 68 generates a control signal S_UD, and supplies the control signal S_UD to the phase interpolator 65 according to the SSC profile, and controls the phase shift operation of the phase interpolator 65. FIG. 30 is a diagram illustrating a configuration example of the SSC controller 68 in FIG. 29.

Referring to FIG. 30, a stage counter 681 is configured to measure the number of pulses of a control clock signal C_CNT, and output the present number of stages SC(k). The stage is a period during which one modulation degree is applied to the output clock signal C_OUT (in a period during which the number of stages is identical, the modulation degree of the frequency is kept constant), and the modulation degree of the frequency of the output clock signal C_OUT is changed. A control signal generation unit 682 receives the number of stages SC(k) from a stage counter 681, and outputs the control signal S_UD indicative of a phase shift amount.

The PLL having the SSC controller 68 in FIG. 30 realizes the SSC clock generator that can suppress jitter of the SSC clock, and smoothly transit a frequency modulation amount (modulation degree).

(Operation Example of PLL)

FIG. 31 shows timing charts (A), (B), and (C) illustrating the operation of the PLL in FIG. 29. The axis of abscissa is a time.

In (A) to (C) of FIG. 31, F_OUT of (A) illustrates a frequency F_OUT of the output clock signal C_OUT in FIG. 29. The frequency is reduced from f=1.5 GHz by Δf=D_SSC(−5000 ppm), and again returned to f=1.5 GHz in one cycle T_SSC=32 μsec. In (B) of FIG. 31, a time (μs: 0 to 31 μs) corresponds the number of stages SC(k) (k=0 to 31).

In (C) of FIG. 31, S_UD is an output signal S_UD of the SSC controller 68 (control signal generation unit in FIG. 30).

In this example, S_UD=0 to 16 is met, and S_UD=1 corresponds to −5000 ppm/16=−312.5 ppm, and the frequency variation of F_OUT is changed according to a value of S_UD.

In the example described in the above condition 1, SSC_MOD=1 corresponds to 312.5 ppm. In FIG. 29, S_UD=1 corresponds to −312.5 ppm.

When S_US is inverted in sign, and output from the PLL, S_UD can be used as SSC_MOD in FIG. 1.

If the spread-spectrum frequency variation per SSC_MOD=1 is different from the spread-spectrum frequency variation per S_UD=1, S_UD is multiplied by a constant in use.

For example, in the case of 156.25 ppm per SSC_MOD=1 and −312.5 ppm per S_UD=1, S_UD is doubled, and used as SSC_MOD.

Description of Operation in First Embodiment

FIGS. 13A to 13D are waveform diagrams illustrating the operation of the first embodiment. A PLL clock frequency of FIG. 13A, a serial data input frequency of FIG. 13B, and (serial data input frequency)−(PLL clock frequency) in FIG. 13C are identical with FIGS. 27A, 27B, and 27C. FIG. 13D is different from FIG. 27D.

In FIG. 13D, FDIF1 and FDIF2 are signals before and after the integrator 13 in FIG. 1.

FDIF2 in FIG. 13D is equivalent to the frequency deviation detected by the CDR frequency tracking loop which is detected in FIG. 27D, and there is a need to track +5000 ppm to −5000 ppm at frequencies 30 to 33 kHz. The following expression is satisfied according to the input FDIF1, (−SSC_MOD), and the output FDIF2 in the adder 18 of FIG. 1.

FDIF1+(−SSC_MOD)=FDIF2

Therefore, FDIF2+SSC_MOD=FDIF1

FDIF1 is equivalent to the spread-spectrum frequency variation of the serial data input.

Accordingly, in FIG. 1, the frequency tracking loop may track the frequency deviation 0 ppm to −5000 ppm at the modulation frequency 30 to 33 kHz.

Also, in the frequency deviation information detected by the clock and data recovery circuit 10A, the frequency deviation of the serial data input is obtained by integrating the past phase comparison results by the integrator 13. For that reason, this frequency deviation is the results obtained by integrating old information as compared with the present time. However, in the adder 18 of FIG. 1, the SSC_MOD input from the PLL 30, which is used for correction of the PLL clock signal frequency deviation, is always latest information (that is, a value of SSC_MOD input to the adder 18 corresponds to the PLL clock signal frequency variation input to the phase interpolator 17 from the PLL 30 at the present time.)

For that reason, in this embodiment, the PLL clock signal frequency modulation does not suffer from such a problem that the characteristics are deteriorated by correction using the old information.

Further, if an inclination (time rate of change) of the frequency deviation becomes gentle, the number of counts in the integrator 13 in the frequency tracking loop within the clock and data recovery circuit can be increased (resolution capability can be improved), and an improvement in the low-pass filter characteristics can also been expected.

(Frequency Tracking Characteristics)

FIGS. 14A to 14E correspond to FIGS. 28A to 28E described above. A graph (I) of FIGS. 14A to 14D is identical with the graph (I) of FIGS. 13A to 13D. In a time frame 160 surrounded by a solid line, the frequency of the PLL clock is going to decrease, and the frequency of the serial data subjected to the spread-spectrum frequency modulation is going to increase. As an operation image in this case, a positional relationship of the serial data and the extracted clock is schematically illustrated in FIG. 14E.

It is assumed that a left end of the portion surrounded by the time frame 160 is a time. That is, the PLL clock signal frequency is −2500 ppm (SSC_MOD=−2500 ppm), and is going to head to −5000 ppm from here.

The serial data input frequency is −2500 ppm, which is going to head to 0 ppm from here. In the frequency tracking loop within the clock and data recovery circuit, FDIF1=−2500 ppm, and FDIF2=FDIF1−SSC_MOD=−2500 ppm−(−2500 ppm)=0 ppm are met.

In the frequency deviation detected by the CDR frequency tracking loop of FIG. 14D, a value obtained by adding (−SSC_MOD) to FDIF1 is FDIF2, and the frequency deviation detected by the CDR frequency tracking loop apparently falls within a range of 0 to −5000 ppm of FDIF1.

A waveform of FIG. 14E will be described. In FIG. 14E, waveforms (1) represent the waveforms of the serial data and the extracted clock signal at a start (left end) and an end (right end) of the time frame 160 when both of the clock and the serial data are not subjected to the spread-spectrum frequency modulation so that their frequencies are always kept constant, FDIF2=0 ppm is kept, and the clock and data recovery circuit does not conduct the phase control at all. In this case, the extracted clock signal continues to sample a middle of the serial data input.

However, in fact, the clock signal and the serial data are each subjected to SSC, and the frequency of the serial data input is going to increase. On the other hand, although the frequency of the PLL clock signal becomes low, even if the frequency tracking loop within the clock and data recovery circuit stops (FDIF1=−2500 ppm is fixed as it is), the frequency of the extracted clock signal is not changed.

This is because, for example, when the PLL clock signal frequency is reduced to −3000 ppm, since SSC_MOD is also reduced to −3000 ppm, and FDIF2=FDIF1−(SSC_MOD)=−2500 ppm−(−3000 ppm)=+500 ppm is met, the extracted clock signal frequency becomes (PLL clock signal frequency)+(control by FDIF2)=−3000+500=−2500 ppm is met.

Accordingly, as shown in the wave (2) of FIG. 14E, the phase of the extracted clock signal is not changed. In FIG. 14E, waveforms (2) represent the waveforms of the serial data and the extracted clock signal at a start (left end) and an end (right end) of the time frame 160 when both of the clock and the serial data are not subjected to the SSC, and the phase tracking loop and the frequency tracking loop within the clock and data recovery circuit do not conduct the phase control (correction of the frequency deviation in the frequency tracking loop by SSC_MOD is valid). The phase of the data signal is advanced, but the phase of the extracted clock signal is not changed. For that reason, in the waveform (2) in FIG. 14E, as compared with the waves (2) in FIG. 28E, the deviation of the phase between the extracted clock signal and the serial data is reduced.

Finally, waveforms (3) in FIG. 14E represent the waveforms of the serial data and the extracted clock signal at a start (left end) and an end (right end) of the time frame 160 when both of the PLL clock and the serial data are subjected to SSC, the phase tracking loop within the clock and data recovery circuit does not conduct the phase control, but the frequency tracking loop conducts the phase control.

The effects of the first embodiment will be described. According to the first embodiment, the frequency tracking loop of the clock and data recovery circuit 10A may track a range of the frequency modulation 0 ppm to −5000 ppm in a cycle corresponding to the modulation frequency 30 kHz to 33 kHz, and a load on the clock and data recovery circuit 10A is reduced to half. Further, the characteristics (for example, jitter tolerance characteristics) are improved.

In the first embodiment, SSC_MOD input from the PLL 30 to the adder 18 connected to the output of the integrator 13 in the frequency tracking loop 101 corresponds to the PLL clock signal frequency variation input to the phase interpolator 17 from the PLL 30 at the present time (the frequency variation of the PLL clock signal is defined by SSC_MOD). For that reason, there arises no problem that the characteristics are deteriorated by correcting the old information.

Also, because the inclination (time rate of change) of the frequency deviation (the frequency deviation between serial data input frequency and the PLL clock frequency) detected by the CDR frequency tracking loop becomes gentle, the number of counts in the integrator 13 in the frequency tracking loop within the clock and data recovery circuit 10A can be increased (resolution capability can be improved), and the improvement in the low-pass filter characteristics can also been expected.

Modification of First Embodiment

A modification of the first embodiment will be described. A configuration of a modification 1 is identical with that in the first embodiment, but is effective even in a case where the serial data input is not subjected to the spread-spectrum frequency modulation. As illustrated in FIG. 15A, the PLL clock signal is subjected to the spread-spectrum frequency modulation. However, as illustrated in FIG. 15B, the frequency of the serial data input is kept constant (0 ppm). As illustrated in FIG. 15C, (serial data input frequency)–(PLL clock frequency) is a chopping waveform (saw tooth wave) that is varied in a range of 0 ppm to +5000 ppm. As illustrated in FIG. 15D, in the frequency deviation detected by the CDR frequency tracking loop, FDIF2 is changed in a range of 0 ppm to +5000 ppm, and FDIF1 is not changed in the vicinity of 0 ppm.

In the modification, the frequency tracking loop of the clock and data recovery circuit may track 0 ppm (FDIF1).

Thus, the first embodiment is effective even in the case where the serial data input is not subjected to the spread-spectrum frequency modulation. In this case, there is no necessary to track the frequency deviation between the serial data frequency and the PLL clock signal frequency.

Second Embodiment

FIG. 16 is a diagram illustrating a configuration of a second embodiment. In the first embodiment, the clock signal spread-spectrum frequency variation is added by the adder 18 after the integrator 13. Alternatively, the adder 18 may be arranged before (on an input side of) the integrator 13. A clock and data recovery circuit 10B configured as described above is illustrated in FIG. 16 as the second embodiment. When addition is conducted before the integrator 13, differential of the spread-spectrum frequency modulation (information obtained by differentiating the frequency modulation waveform with time), that is, the inclination of the frequency modulation curve (frequency profile) is added. Accordingly, in FIG. 16, a loop that passes the mixer 16 through the phase detector 12, an adder 19, the integrator 13, and the pattern generator 15 configures the frequency tracking loop 101, and a loop that passes the mixer 16 through the phase detector 12 and the integrator 14 configures the phase tracking loop 102.

The inclination of the spread-spectrum frequency modulation can be expressed by two elements of a magnitude (SSC_DF) (0 or more) of the inclination of the spread-spectrum frequency modulation, and a direction (SSC_DIR) (plus or minus) of the inclination thereof, and therefore can be realized by the configuration of FIG. 16.

In the adder 19, the magnitude (SSC_DF) of the inclination is switchingly added or subtracted with respect to UP1/DOWN1 according to the direction (SSC_DIR) of the inclination of the variation pattern (for example, a chopping wave) of the spread-spectrum frequency modulation.

A case in which the direction of the inclination of the variation pattern (for example, chopping wave) of the spread-spectrum frequency modulation is minus is indicative of addition, and a case in which the direction of the inclination of the variation pattern (for example, chopping wave) of the spread-spectrum frequency modulation is plus is indicative of subtraction.

Figure 17:
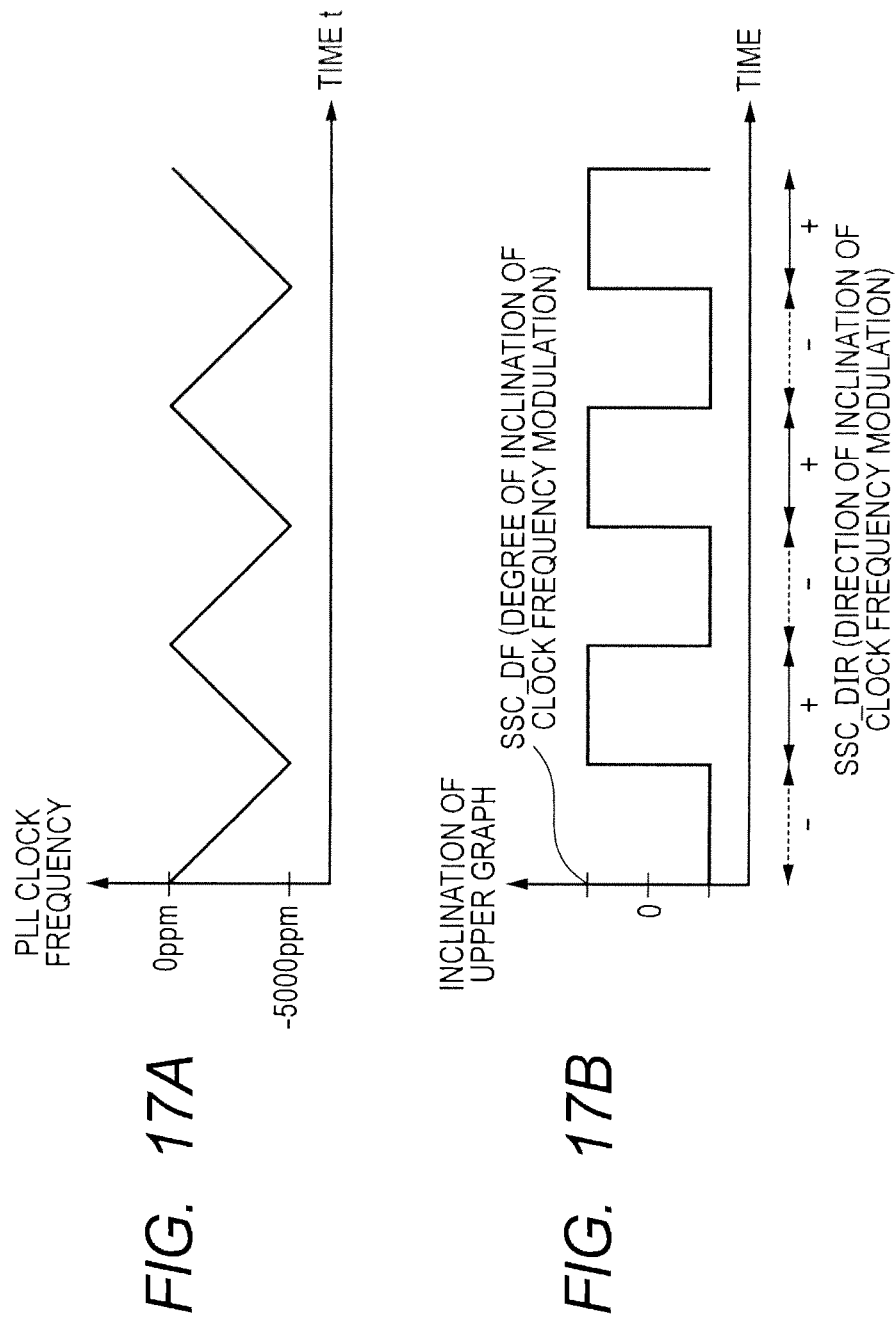
FIGS. 17A and 17B are diagrams illustrating an inclination of the spread-spectrum frequency modulation according to the second embodiment.

FIGS. 17A and 17B are diagrams illustrating the magnitude of the inclination of the spread-spectrum frequency modulation, and the direction of the inclination thereof when the variation pattern of the SSC profile of the PLL 30 is the chopping wave. FIG. 17A illustrates the SSC profile (frequency variation pattern). FIG. 17B illustrates the inclination of the PLL clock signal frequency in FIG. 17A. The inclination of the spread-spectrum frequency modulation alternately takes a plus value and a minus value. However, an absolute value of those values is always kept constant.

The magnitude SSC_DF of the inclination of the spread-spectrum frequency modulation is the absolute value, and the direction SSC_DIR of the inclination corresponds to signs (plus, minus).

(Adder)

Figure 18:
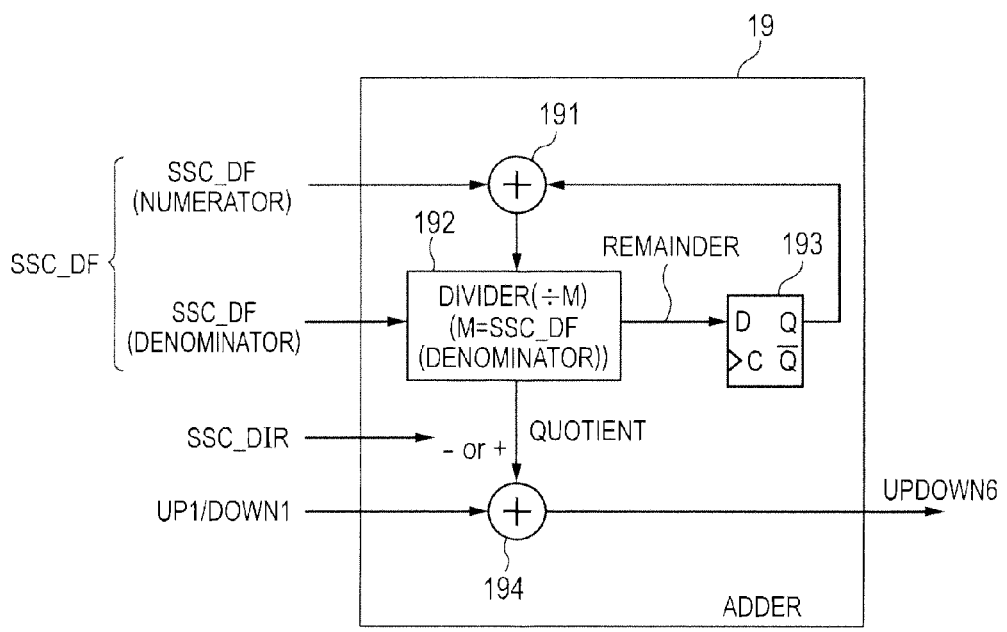
FIG. 18 is a diagram illustrating an adder according to the second embodiment.

FIG. 18 is a diagram illustrating an example in which the adder 19 of FIG. 16 is configured by a digital circuit. Referring to FIG. 18, it is assumed that the magnitude SSC_DF of the inclination of the spread-spectrum frequency modulation is expressed by a fraction. In an adder 191, a flip flop 193 (arithmetic result at a time point before one clock cycle) and a SSC_DF (numerator) are added together. In a divider 192, an addition result of the adder 191 is divided by SSC_DF (denominator) in integer to calculate a quotient and a remainder. The remainder is input to the flip flop 193. The quotient is added to UP1/DOWN1 by an adder 194.

When addition is conducted by the adder 194, if SSC_DIR is plus, the sign of the quotient is inverted, and added to UP1/DOWN1. If SSC_DIR is minus, the quotient is added to UP1/DOWN1.

The flip flop 193 is configured by the number of bits (6 bits when a maximum value of the remainder is 63) necessary to express the remainder.

Although not clearly illustrated in FIG. 18, when the direction of the inclination of the spread-spectrum frequency modulation is changed from plus to minus or from minus to plus, the flip flop 193 in FIG. 18 may be reset.

(Operation of Adder 19)

The operation of the adder 19 in FIG. 18 will be described. As an example, it is assumed that the magnitude SSC_DF of the inclination of the spread-spectrum frequency modulation is SSC_DF=1/64. The numerator of SSC_DF is 1, and the denominator thereof is 64.

The output of the flip flop 193 is incremented by one in the stated order of 0, 1, . . . , 63, and in a subsequent clock signal, the addition result of the output of the flip flop 193 and SSC_DF (numerator) becomes 64.

In this situation, the quotient of the divider 192 becomes +1, and +1 or −1 is added to UP1/DOWN1 according to SSC_DIR.

The remainder of the divider 192 becomes 0, and the flip flop 193 becomes 0. Accordingly, +1 or −1 is added to UP1/DOWN1 at a rate of once in 64 clock cycles.

As a result, the same effect as that when 1/64 is added to UP1/DOWN1 is obtained. Specific numerical value examples will be described below.

(Condition 2)

Data rate: 5.0 [Gbps];

PLL clock signal: 2.5 [GHz] clock signal subjected to chopping wave modulation of 0 to −5000 ppm in a 30 [kHz] cycle;

Output signal frequency of phase detector 12 (=operating frequency of integrators 13, 14, pattern generator 15, mixer 16, and adder 19): 1.25 [GHz];

Resolution capability of phase interpolator 17: 1 step corresponds to 1/32 of received data 1UI;

Integrator 13 of frequency tracking loop (FIG. 8): a first count is set to 8 (when input UP is increased by 8, UP is output, and the counter is reset, and when DOWN is increased by 8, DOWN is output, and the counter is reset):

Division N=64 of pattern generator 15 (FIG. 9) (Numerical Value Example)

Under the above conditions, the magnitude of the frequency deviation per FDIF3=1 is calculated.

In the case of FDIF3=1, the output UPDOWN4 of the pattern generator 15 outputs +1 with a probability of once in 64 cycles of the clock signal at 1.25 GHz (corresponding to 1/4 of the data rate). With UPDOWN4=+1, the phase of the clock signal is shifted by (1/32)UI.

Accordingly, UPDOWN4 corresponding to the frequency deviation of (1/4)×(1/64)×(1/32)×1000000=122.07 [ppm] per FDIF3=1 occurs.

Subsequently, an optimum value of SSC_DF is calculated. Since the first counter (131 in FIG. 8) of the integrator 13 in the frequency tracking loop is 8, the frequency deviation per UPDOWN6=1 is 122.07 ppm/8=15.26 ppm.

Since the inclination of the spread-spectrum frequency modulation of the clock signal has a variation of 10000 ppm at 33 us, 10000 ppm/33 us is obtained.

Since 10000 ppm/33 us=15.26 ppm/50.4 ns (nanosecond) is met, addition is conducted so that UPDOWN6 is changed by 1 during 50.4 ns.

Since the operating frequency subsequent to the output of the phase detector 12 is 1.25 GHz=0.8 ns, 1 may be added or subtracted once in 50.4 ns/0.8 ns=63 clock cycles according to the direction of the SSC inclination.

When SSC_DF is expressed by a fraction, SSC_DF=1/63 is met.

In this embodiment of FIG. 18, SSC_DF(numerator)=1, and SSC_DF(denominator)=M=63 are met.

(SSC_DIR)

Subsequently, a method of generating SSC_DIR will be described. Referring to FIGS. 31A to 31C, if a value of S_UD is increased in the stated order of 0, 1, 2, ..., 15, 16 with time, the frequency modulation is increased, and the PLL clock signal frequency is decreased with time. If S_UD is decreased in the stated order of 16, 15, 14, ..., 1 with time, the frequency modulation comes close to 0, and the PLL clock signal frequency is increased.

Accordingly, in the case of the frequency profile (frequency variation pattern) of FIG. 31A, SSC_DIR is set to minus in a period where S_UD becomes larger whereas the SSC_DIR set to plus in a period where S_UD becomes smaller.

Since SSC_DIR is determined according to a direction (increase or decrease with time) of updating S_UD, SSC_DIR can be easily generated while S_UD is generated.

In the first embodiment, SSC_MOD (spread-spectrum frequency variation) is transferred from the PLL 30 to the clock and data recovery circuit 10A. SSC_MOD is changed at the modulation frequency 30 to 33 kHz.

In general, because the spread-spectrum frequency variation of the clock signal is asynchronous with the operating clock signal of the clock and data recovery circuit, attention needs to be paid to delivery of that signal. Specifically, it is better to convert the signal into not a binary code but a gray code, and change only one bit.

In the second embodiment, when the frequency variation pattern of the clock signal is a chopping wave (when SSC is chopping wave modulation), the magnitude of the inclination of the spread-spectrum frequency modulation is always kept constant.

The kind of the direction of the inclination of the spread-spectrum frequency modulation is only two of the plus direction (frequency is increased) and the minus direction (frequency is decreased). For that reason, the direction of the inclination of the spread-spectrum frequency modulation can be expressed by one bit. This is changed at the modulation frequency 30 to 33 kHz. That is, since the changed signal is only one bit of the direction of the inclination, the delivery from the PLL 30 to the clock and data recovery circuit 10B is facilitated. According to the second embodiment, there is obtained the effect of facilitating the delivery from the PLL 30 to the clock and data recovery circuit 10B in addition to the effect of the first embodiment.

Third Embodiment

FIG. 19 is a diagram illustrating a configuration of a third embodiment. The integrator 14 arranged in the phase tracking loop in the first embodiment of FIG. 1 is shifted to a post-stage of the mixer 16. That is, as illustrated in FIG. 19, in the third embodiment, the integrator 14 is arranged at the post-stage of the mixer 16, and the output of the mixer 16 is UPDOWN7. A clock and data recovery circuit 10C configured as described above is illustrated in FIG. 19. Therefore, in FIG. 19, a loop that passes the mixer 16 through the phase detector 12, the integrator 13, the adder 18, and the pattern generator 15 configures the frequency tracking loop 101, and a loop that passes the mixer 16 through the phase detector 12 configures the phase tracking loop 102.

Figure 20:
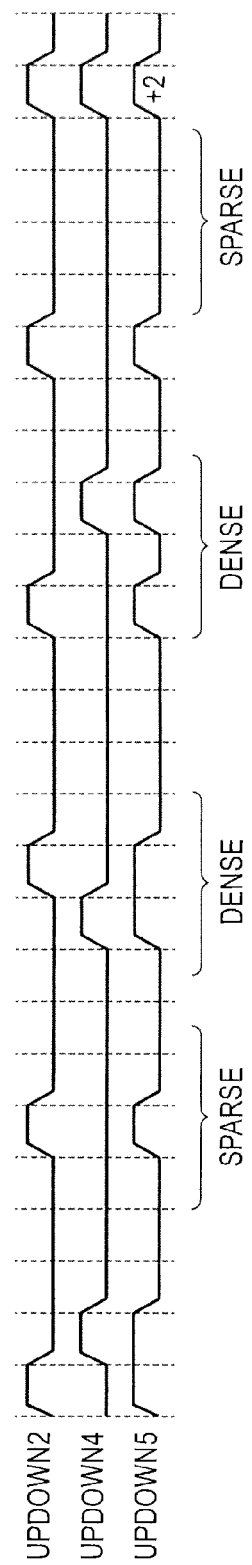
FIG. 20 is a diagram illustrating the operation of the third embodiment.

As in the first embodiment illustrated in FIG. 1, when inputs UPDOWN2 (output of the integrator 14) and UPDOWN4 (output of the pattern generator 15) of the mixer 16 are merely added together, as illustrated in FIG. 20, sparse and dense are generated in the output UPDOWN5 of the mixer 16 on a time axis.

It is assumed that UPDOWN2 is once +1 in five clock cycles, and UPDOWN4 is once +1 in eight clock cycles. As a result of adding those values together, coarse and dense are generated in UPDOWN5.

In FIG. 20, UPDOWN5 has a sparseness (one pulse having a plus width corresponding to one interval within a time range indicated by sparse), a denseness (one pulse having a plus width corresponding to two intervals within a time range indicated by dense), a denseness (two pulses at a distance of one interval, each having a plus width corresponding to one interval within a time range indicated by the dense), and a sparseness (no pulse within a time range indicated by the sparse).

In the third embodiment, the integrator 14 disposed at a pre-stage of the mixer 16 in the first embodiment of FIG. 1 is shifted to a post-stage of the mixer 16, to thereby smooth (average) the sparseness and denseness of the output UPDOWN7 of the mixer 16.

The integrator 14 is configured by an UP/DOWN counter as with the integrator 14 in the first embodiment.

The mixer 16 is configured as illustrated in FIG. 10, and adds the output UP1/DOWN1 of the phase detector 12, and outputs an addition result as UPDOWN7, instead of UPDOWN2.

According to the third embodiment, the sparseness and denseness of the output UPDOWN7 of the mixer 16 are smoothed, thereby being capable of improving the characteristics.

Fourth Embodiment

FIG. 21 is a diagram illustrating a configuration example of a fourth embodiment. Referring to FIG. 21, in the fourth embodiment, the integrator 14 in the phase tracking loop is shifted to a post-stage of the mixer 16 from the position in the above second embodiment of FIG. 16. The adder 19 in FIG. 21 is arranged in a pre-stage of the integrator 13, and has the same configuration as that of the adder 19 in the above second embodiment of FIG. 16. Then, the adder 19 inputs a value UPDOWN6 obtained by adding or subtracting the magnitude SSC_DF of the inclination of the frequency variation pattern of the spread-spectrum frequency modulation of the PLL clock signal with respect to the output UP1/DOWN1 of the phase detector 12 on the basis of the direction SSC_DIR of the inclination, to the integrator 13. The adder 19 in FIG. 21 is configured as illustrated in FIG. 18 as in the above second embodiment.

A clock and data recovery circuit 10D configured as described above is illustrated in FIG. 21. Therefore, in FIG. 21, a loop that passes the mixer 16 through the phase detector 12, the adder 19, the integrator 13, and the pattern generator 15 configures the frequency tracking loop 101, and a loop that passes the mixer 16 through the phase detector 12 configures the phase tracking loop 102.

In the fourth embodiment, as in the third embodiment, the sparseness and denseness of the output UPDOWN7 of the mixer 16 are smoothed (averaged).

Similarly, in the fourth embodiment, when the frequency variation pattern of the clock signal is a chopping wave (when SSC is chopping wave modulation), the magnitude of the inclination of the spread-spectrum frequency modulation is always kept constant. The kind of the direction of the inclination is only two of the plus direction (frequency is increased) and the minus direction (frequency is decreased). For that reason, the direction of the inclination can be expressed by one bit. This is changed at the modulation frequency 30 to 33 kHz. That is, since the changed signal is only one bit of the direction of the inclination, the delivery from the PLL 30 to the clock and data recovery circuit 10D is facilitated.

Fifth Embodiment

FIG. 22 is a diagram illustrating a configuration example of a fifth embodiment. Referring to FIG. 22, the SSC_DF is output from a control circuit 20. When the frequency variation pattern of the clock signal is a chopping wave (chopping wave modulation) (when SSC is chopping wave modulation), the magnitude SSC_DF of the inclination of the spread-spectrum frequency modulation is always kept constant (the direction of the inclination is − (minus) when the direction of the inclination is monotonically decreased from 0 ppm to −5000 ppm, and the direction of the inclination is + (plus) when the direction of the inclination is monotonically increased from −5000 ppm to 0 ppm, where the magnitude of the inclination is kept constant at the monotonic decrease time and the monotonic increase time). That is, when the chopping modulation is applied as the spread-spectrum frequency modulation, SSC_DF is a fixed value. In FIG. 22, the configuration of the frequency tracking loop 101 and the phase tracking loop 102 is identical with that in FIG. 21.

When the SSC_DF is the fixed value, there is no need to calculate SSC_DF within the PLL 30 (SSC controller 68 in FIG. 29). SSC_DF can be calculated according to the modulation frequency (for example, 30 kHz) and the maximum spread-spectrum frequency variation (for example, −5000 ppm), which are SSC setting information. The calculation method is described in (numerical value example) calculated in the above (condition 2).

In the fifth embodiment, the control circuit 20 is provided in addition to the clock and data recovery circuits 10E and the PLL 30. SSC setting information (modulation frequency and maximum spectrum diffusion frequency variation) is output from the control circuit 20 to the PLL 30, and the PLL 30 subjects the PLL clock signal to the SSC in response to the SSC setting information.

On the other hand, the control circuit 20 calculates the spread-spectrum frequency modulation inclination SSC_DF, and outputs SSC_DF to the adder 19 of a clock and data recovery circuit 10E. The clock and data recovery circuit 10E is identical with that in the above fourth embodiment of FIG. 21. The configuration of the adder 19 arranged at the pre-stage of the integrator 13 is identical with that in FIG. 18, and therefore its description will be omitted.

According to the fifth embodiment, when the chopping wave modulation is applied as the frequency modulation of the SSC, there is no need to calculate the magnitude SSC_DF of the inclination of the spread-spectrum frequency modulation within the PLL 30 (SSC controller 68 in FIG. 29), which contributes to a reduction in the circuit scale of the PLL, and a reduction in the power consumption of the circuit.

Sixth Embodiment

Figure 23:
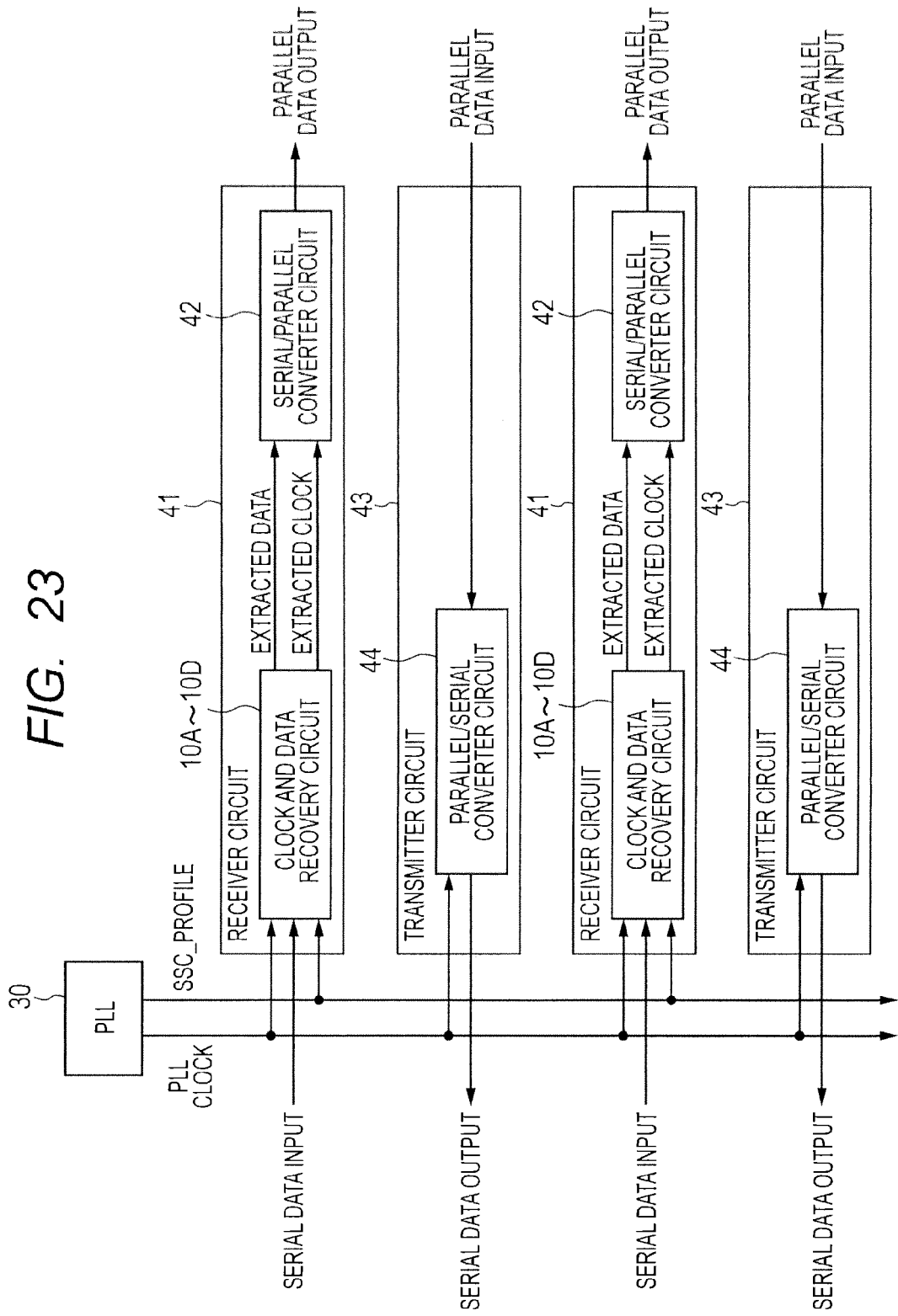
FIG. 23 is a diagram illustrating a configuration example of a serdes circuit according to a sixth embodiment.
Figure 25:
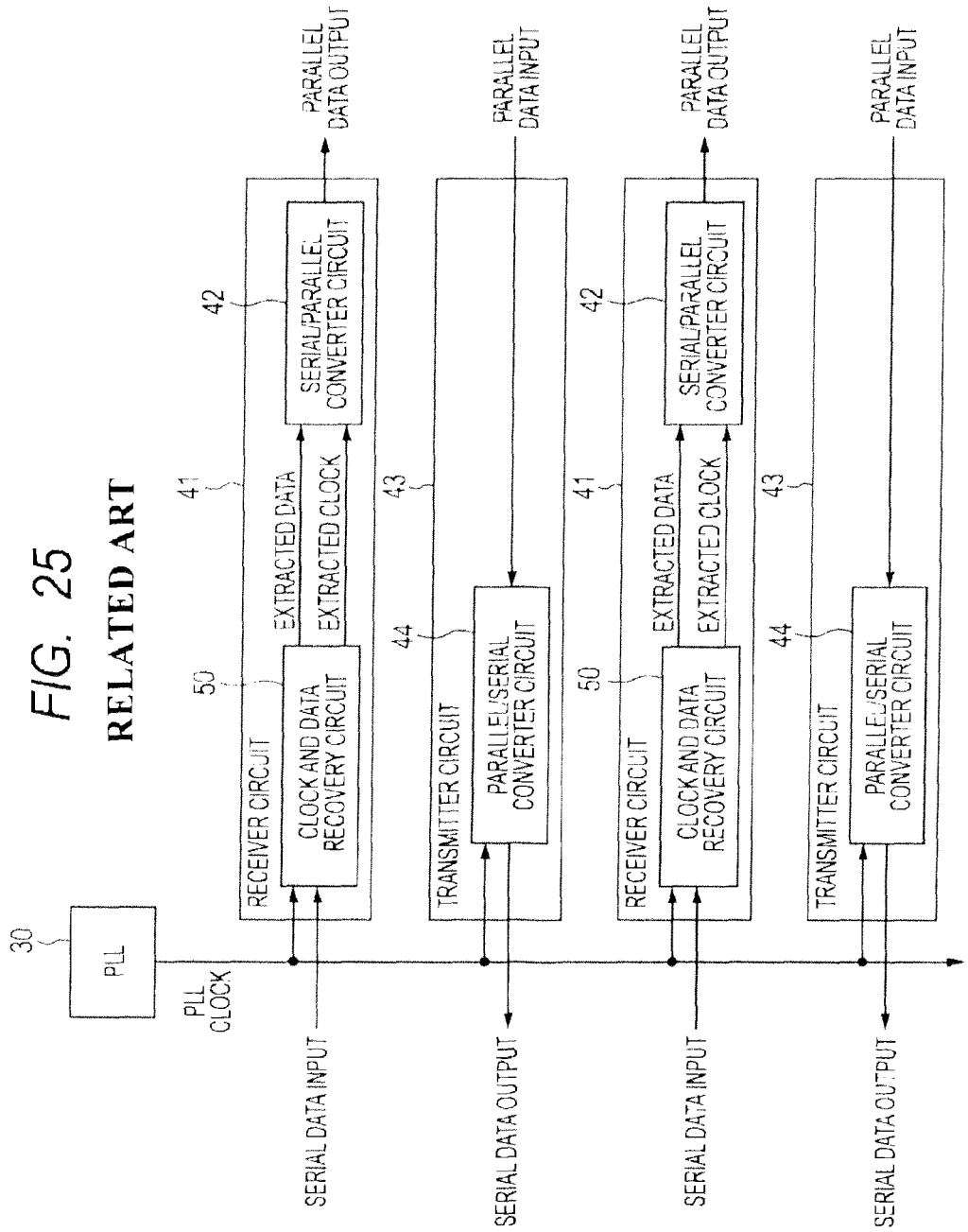
FIG. 25 is a diagram illustrating a configuration of a serdes circuit in a related art.

FIG. 23 is a diagram illustrating a configuration of a sixth embodiment. FIG. 23 illustrates an example of the configuration of the serdes having clock and data recovery circuit (10A to 10D) of the above-mentioned embodiments (first to fourth embodiments) in FIG. 25 described above. As illustrated in FIG. 23, one or more transmitter circuits 43 and one or more receiver circuits 41 are coupled to one PLL 30. The clock and data recovery circuit (any one of the above mentioned 10A, 10B, 10C, and 10D), and the serial/parallel converter circuit 42 that converts the serial data extracted in the clock and data recovery circuit (any one of the above-mentioned 10A, 10B, 10C, and 10D) into parallel data with the use of the extracted clock signal are disposed within the receiver circuits 41. The extracted clock signal and the parallel data from the serial/parallel converter circuit 42 are supplied to an internal circuit not shown.

The PLL 30 outputs the SSC profile information (spread-spectrum frequency variation or the inclination (differentiation) of the spread-spectrum frequency modulation), and one or more clock and data recovery circuits receive the SSC profile information, and recovers clock and data. The serdes thus configured operates the transmitter circuit with the clock signal subjected to the spread-spectrum frequency modulation, thereby being capable of outputting data subjected to the spread-spectrum frequency modulation.

In the sixth embodiment, the clock and data recovery circuit (10A to 10D) obtains the same advantage as that described in the first to fourth embodiments with the use of the SSC profile information.

Seventh Embodiment

FIG. 24 is a diagram illustrating a configuration example of a serdes according to a seventh embodiment. In the seventh embodiment, each of the receiver circuits 41 includes the clock and data recovery circuit 10E of the above fifth embodiment.

As with the fifth embodiment of FIG. 22, the control circuit 20 sets the SSC for the PLL 30. Also, the magnitude SSC_DF of the inclination of the spread-spectrum frequency modulation is input to the clock and data recovery circuit 10E from the control circuit 20, and the direction SSC_DIR of the inclination is input to the clock and data recovery circuit 10E from the PLL 30. The configuration and the operation of the control circuit 20 and the clock and data recovery circuit 10E are identical with those of the fifth embodiment, and therefore their description will be omitted.

According to the seventh embodiment, when the chopping wave modulation is applied as the frequency modulation of the SSC, there is no need to calculate the magnitude SSC_DF of the inclination of the spread-spectrum frequency modulation within the PLL 30 (SSC controller 68 in FIG. 29), which contributes to a reduction in the circuit scale of the PLL 30, and a reduction in the power consumption of the circuit.

In the above description, SSC_MOD and SSC_DF are digital quantity, and the integrators, the pattern generators, the mixers, and the adders are formed of digital circuits. However, analog circuits using the analog quantity (voltage or current) may be applied. Also, the PLL may be configured by a digital circuit (for example, all digital PLL, etc.). Also, as usage, the circuit that generates the SSC clock signal is not limited to the PLL with the SSC function, but may be an arbitrary SSC clock generator such as a synthesizer that generates an SSC clock from a reference clock signal.

Also, in the above embodiments, as the SSC, the down diffusion in which the frequency fc is reduced to $(1-\delta)$fc ($\delta$ is diffusivity), and returned to fc in one cycle is described. Also, an up diffusion in which the frequency fc is increased to $(1+\delta)$fc, and then returned to fc in one cycle can be applied in the same manner, for example, by inverting the sign of SSC_MOD (SSC_DF) in the adders 18 and 19 in FIGS. 1 and 16 contrary to the down diffusion. Further, center diffusion in which the frequency $(1-\delta)$fc is increased to $(1+\delta)$fc, and then returned to $(1-\delta)$fc in one cycle can be applied in the same manner.

The invention made by the present inventors has been described specifically on the basis of the embodiments. However, the present invention is not limited to the above-mentioned embodiments, but can be variously modified without departing from the spirit of the present invention. The respective disclosure of the above-mentioned Patent Publications is incorporated herein by reference in its entirety. Embodiments and modification or change of the embodiments can further been conducted on the basis of the basic technical concept without departing all disclosure (including claims) of the present invention. Also, various disclosed elements (including respective elements of each claim, respective elements of each embodiment, and respective elements in each drawing) can be variously combined together, or selected without departing from the scope of the claims in the present invention. That is, the present invention includes various modifications and changes that could be conceived by one skilled in the art on the basis of all disclosure including the claims, and the technical concept.

What is claimed is:

1. A semiconductor device having a serdes (serializer/deserializer) that mutually convert serial data and parallel data, comprising:
   one or more pairs of transmitter circuits and receiver circuits; and
   a PLL (phase locked loop) which is connected with one or more of the transmitter circuits and one or more of the receiver circuits, and includes an SSC (spread spectrum clocking) controller, and outputs an SSC clock signal,
   wherein each of the transmitter circuits receives the SSC clock signal subjected to the spread-spectrum frequency modulation from the PLL, and conducts parallel/serial conversion on the basis of the SSC clock signal, to thereby output the serial data that has been subjected to the spread-spectrum frequency modulation,
   wherein each of the receiver circuits, comprising:
   a phase detector that detects an advance and a retard of a phase between input data and an extracted clock signal;
   a frequency tracking loop that conducts a tracking control to reduce a frequency deviation between a frequency of the input data and a frequency of the extracted clock signal on the basis of a result of integrating a detection result of the phase detector together; and
   a phase interpolator that receives the SSC clock signal subjected to spread-spectrum frequency modulation from the PLL, adjusts a phase of the SSC clock signal on the basis of a detection result of the frequency deviation in the frequency tracking loop, and supplies the SSC clock signal to the phase detector as the extracted clock signal,
   wherein the frequency tracking loop receives frequency modulation information corresponding to the SSC clock signal subjected to the spread-spectrum frequency modulation from the PLL, corrects the frequency deviation on the basis of the frequency modulation information, and reduces the frequency modulation of the clock signal.

2. The semiconductor device according to claim 1,
   wherein the frequency tracking loop includes a circuit that adds or subtracts the frequency modulation information to or from an output or an input of a first integrator that integrates the detection result of the phase detector together.

3. The semiconductor device according to claim 1,
   wherein the input data is data subjected to the spread-spectrum frequency modulation by a source of the input data, and received by a clock and data recovery circuit.

4. The semiconductor device according to claim 1,
   wherein the input data is data having a constant frequency at a source of the input data, and received by a clock and data recovery circuit.

5. The semiconductor device according to claim 1,
   wherein the frequency tracking loop comprises:
   a first integrator that integrates a first control signal which is the phase detection result of the phase detector, and outputs a second control signal;

an arithmetic unit that outputs a result of adding the second control signal and a signal obtained by inverting a sign of the frequency modulation information as a third control signal; and a pattern generator that receives the third control signal, and outputs a fourth control signal, wherein a phase tracking loop includes a second integrator that integrates the first control signal which is the phase detection result of the phase detector together, and outputs a fifth control signal, wherein a mixer that mixes the fourth control signal from the pattern generator and the fifth control signal from the second integrator together to output a sixth control signal is disposed at a junction of the frequency tracking loop and the phase tracking loop, and wherein the phase interpolator interpolates the phase of the clock signal subjected to the spread-spectrum frequency modulation on the basis of the sixth control signal from the mixer.

6. The semiconductor device according to claim 1, wherein the frequency tracking loop comprises:

a first integrator that integrates a first control signal which is the phase detection result of the phase detector together, and outputs a second control signal;

an arithmetic unit that outputs a result of adding the second control signal and a signal obtained by inverting a sign of the frequency modulation information as a third control signal; and a pattern generator that receives the third control signal, and outputs a fourth control signal, wherein a phase tracking loop transmits the first control signal from the phase detector, wherein a mixer that mixes the fourth control signal from the pattern generator and the first control signal from the phase detector together to output a fifth control signal is disposed at a junction of the frequency tracking loop and the phase tracking loop, wherein the semiconductor device further comprises a second integrator that integrates the fifth control signal together, and outputs a sixth control signal, wherein the phase interpolator interpolates the phase of the clock signal subjected to the spread-spectrum frequency modulation on the basis of the sixth control signal from the second integrator.

7. The semiconductor device according to claim 1, wherein the frequency tracking loop comprises:

an arithmetic unit that adds or subtracts an inclination of a spread-spectrum frequency modulation waveform to or from a first control signal which is the phase detection result of the phase detector as the frequency modulation information, and outputs the arithmetic result as a second control signal;

a first integrator that integrates the second control signal together, and outputs a third control signal; and a pattern generator that receives the third control signal, and outputs a fourth control signal, wherein a phase tracking loop includes a second integrator that integrates the first control signal which is the phase detection result of the phase detector together, and outputs a fifth control signal, wherein a mixer that mixes the fourth control signal from the pattern generator and the fifth control signal from the second integrator together to output a sixth control signal is disposed at a junction of the frequency tracking loop and the phase tracking loop, and wherein the phase interpolator interpolates the phase of the clock signal subjected to the spread-spectrum frequency modulation on the basis of the sixth control signal from the mixer.

8. The semiconductor device according to claim 7, wherein an absolute value of a magnitude of an inclination of the spread-spectrum frequency modulation waveform is kept a constant value through a modulation period.

9. The semiconductor device according to claim 7, wherein in a magnitude of an inclination and a direction of the inclination of the spread-spectrum frequency modulation waveform, the arithmetic unit sets a value obtained by subtracting or adding the magnitude of the inclination of the spread-spectrum frequency modulation waveform from or to the first control signal according to the direction of the inclination as the second control signal.

10. The semiconductor device according to claim 7, wherein in a magnitude of an inclination and a direction of the inclination of the spread-spectrum frequency modulation waveform, the arithmetic unit includes a circuit that outputs +1 by the number of times corresponding to a numerator of a fraction for the magnitude of the inclination of the spread-spectrum frequency modulation waveform represented by the fraction in an elapsed clock cycle corresponding to a denominator of the fraction, and a circuit that adds or subtracts +1 output from the circuit to or from the first control signal according to the direction of the inclination of the spread-spectrum frequency modulation waveform as the second control signal.

11. The semiconductor device according to claim 1, wherein the frequency tracking loop comprises:

an arithmetic unit that adds or subtracts an inclination of a spread-spectrum frequency modulation waveform to or from a first control signal which is the phase detection result of the phase detector as the frequency modulation information, and outputs the arithmetic result as a second control signal;

a first integrator that integrates the second control signal together, and outputs a third control signal; and a pattern generator that receives the third control signal, and outputs a fourth control signal, wherein a phase tracking loop transmits the first control signal from the phase detector, wherein a mixer that mixes the fourth control signal from the pattern generator and the first control signal from the phase detector together to output a fifth control signal is disposed at a junction of the frequency tracking loop and the phase tracking loop, wherein the semiconductor device further comprises a second integrator that integrates the fifth control signal together, and outputs a sixth control signal, and wherein the phase interpolator interpolates the phase of the clock signal subjected to the spread-spectrum frequency modulation on the basis of the sixth control signal from the second integrator.

12. The semiconductor device according to claim 1, wherein the frequency tracking loop comprises:

an arithmetic unit that adds or subtracts an inclination of a spread-spectrum frequency modulation waveform to or from a first control signal which is the phase detection result of the phase detector as the frequency modulation information, and outputs the arithmetic result as a second control signal;

a first integrator that integrates the second control signal together, and outputs a third control signal; and a pattern generator that receives the third control signal, and outputs a fourth control signal, wherein a phase tracking loop transmits the first control signal from the phase detector, wherein a mixer that mixes the fourth control signal from the pattern generator and the first control signal which is the phase detection result of the phase detector together, and outputs a fifth control signal, and a second integrator that integrates the fifth control signal together, and outputs a sixth control signal, are disposed at a junction of the frequency tracking loop and the phase tracking loop, wherein the phase interpolator interpolates the phase of the clock signal subjected to the spread-spectrum frequency modulation on the basis of the sixth control signal from the second integrator, wherein the semiconductor device further comprises a control circuit that outputs a magnitude of an inclination of the spread-spectrum frequency modulation waveform to a clock and data recovery circuit as the frequency modulation information, and wherein a clock generator outputs a direction of the inclination of the spread-spectrum frequency modulation waveform to the arithmetic unit of the clock and data recovery circuit as the frequency modulation information.

13. The semiconductor device according to claim 12, further comprising: each of the receiver circuits including the clock and data recovery circuit, and a serial/parallel converter circuit that converts serial data extracted by the clock and data recovery circuit into parallel data according to the extracted clock signal, wherein the clock generator and the SSC controller are provided in each of the receiver circuits.

14. The semiconductor device according to claim 1, wherein a clock generator includes the PLL having the SSC controller for generating the SSC clock signal subjected to the spread-spectrum frequency modulation.

15. The semiconductor device according to claim 1, further comprising: each of the receiver circuits including a clock and data recovery circuit, and a serial/parallel converter circuit that converts serial data extracted by the clock and data recovery circuit into parallel data according to the extracted clock signal, wherein a clock generator is provided in each of the receiver circuits.

* * * * *